United States Patent
Lee et al.

(10) Patent No.: US 8,536,652 B2
(45) Date of Patent: Sep. 17, 2013

(54) NON-VOLATILE MEMORY DEVICES INCLUDING LOW-K DIELECTRIC GAPS IN SUBSTRATES

(75) Inventors: Bo-young Lee, Suwon-si (KR); Jong-wan Choi, Suwon-si (KR); Jin-gi Hong, Yongin-si (KR); Myoung-bum Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 33 days.

(21) Appl. No.: 13/224,427

(22) Filed: Sep. 2, 2011

(65) Prior Publication Data

US 2012/0061763 A1    Mar. 15, 2012

(30) Foreign Application Priority Data

Sep. 9, 2010 (KR) .................. 10-2010-0088465

(51) Int. Cl.
*H01L 29/78* (2006.01)
(52) U.S. Cl.
USPC ............................................. 257/365
(58) Field of Classification Search
USPC ............................................. 257/365
See application file for complete search history.

(56) References Cited

U.S. PATENT DOCUMENTS

| | | | | |
|---|---|---|---|---|
| 7,064,382 B2* | 6/2006 | Kodama et al. | .......... | 257/316 |
| 7,384,843 B2* | 6/2008 | Kim et al. | .......... | 438/257 |
| 7,727,893 B2* | 6/2010 | Min et al. | .......... | 438/695 |
| 7,888,208 B2* | 2/2011 | Sheen et al. | .......... | 438/264 |
| 8,158,480 B2* | 4/2012 | Kang et al. | .......... | 438/266 |
| 2006/0081907 A1* | 4/2006 | Sonoda et al. | .......... | 257/314 |
| 2006/0088987 A1* | 4/2006 | Yeo et al. | .......... | 438/488 |
| 2010/0093168 A1* | 4/2010 | Naik | .......... | 438/618 |
| 2012/0049266 A1* | 3/2012 | Oh et al. | .......... | 257/316 |

FOREIGN PATENT DOCUMENTS

| | | |
|---|---|---|
| JP | 2008-283095 | 11/2008 |
| JP | 2009-206152 | 9/2009 |
| JP | 2010-027922 | 2/2010 |
| KR | 1020070046412 A | 5/2007 |
| KR | 10-0739993 B1 | 7/2007 |

* cited by examiner

*Primary Examiner* — Thao Le
(74) *Attorney, Agent, or Firm* — Myers Bigel Sibley & Sajovec, P.A.

(57) ABSTRACT

A method of manufacturing a non-volatile memory device, can be provided by forming a gate insulating layer and a gate conductive layer on a substrate that includes active regions that are defined by device isolation regions that include a carbon-containing silicon oxide layer. The gate conductive layer and the gate insulating layer can be sequentially etched to expose the carbon-containing silicon oxide layer. The carbon-containing silicon oxide layer can be wet-etched to recess a surface of the carbon-containing silicon oxide layer to below a surface of the substrate. Then, an interlayer insulating layer can be formed between the gate insulating layer and the gate conductive layer on the carbon-containing silicon oxide layer, where an air gap can be formed between the carbon-containing silicon oxide layer and the gate insulating layer.

6 Claims, 27 Drawing Sheets

NON-VOLATILE MEMORY DEVICES INCLUDING LOW-K DIELECTRIC GAPS IN SUBSTRATES

CROSS-REFERENCE TO RELATED APPLICATION

This application claims the benefit of Korean Patent Application No. 10-2010-0088465, filed on Sep. 9, 2010, in the Korean Intellectual Property Office, the disclosure of which is incorporated herein in its entirety by reference.

BACKGROUND

The inventive concept relates to the field of electronics, and more particularly, to non-volatile memory devices.

As semiconductor devices have become more highly integrated, gaps between channel areas that are adjacent to each other may become smaller. Accordingly, interference effects between channels may cause cell threshold voltages, Vth, to change.

SUMMARY

Embodiments according to the inventive con concept can provide methods of forming non-volatile memory devices including low-K dielectric gaps in substrates and related devices. Pursuant to these embodiments, a method of manufacturing a non-volatile memory device, can be provided by forming a gate insulating layer and a gate conductive layer on a substrate that includes active regions that are defined by device isolation regions that include a carbon-containing silicon oxide layer. The gate conductive layer and the gate insulating layer can be sequentially etched to expose the carbon-containing silicon oxide layer. The carbon-containing silicon oxide layer can be wet-etched to recess a surface of the carbon-containing silicon oxide layer to below a surface of the substrate. Then, an interlayer insulating layer can be formed between the gate insulating layer and the gate conductive layer on the carbon-containing silicon oxide layer, where an air gap can be formed between the carbon-containing silicon oxide layer and the gate insulating layer.

In some embodiments according to the inventive concept, a method of manufacturing a non-volatile memory device can be provided by forming a tunneling insulating layer and a charge storage layer sequentially on a substrate. A trench can be formed by sequentially etching the charge storage layer, the tunneling insulating layer, and the substrate, to define active regions. A carbon-containing silicon oxide layer can be formed in the trench and a blocking insulating layer can be formed on the charge storage layer and on the carbon-containing silicon oxide layer. A gate conductive layer can be formed on the blocking insulating layer and the gate conductive layer and the blocking insulating layer can be etched to expose the carbon-containing silicon oxide layer. The carbon-containing silicon oxide layer can be wet-etched and an interlayer insulating layer can be formed between the charge storage layer and the gate conductive layer on the carbon-containing silicon oxide layer, where an air gap can be formed between the carbon-containing silicon oxide layer and the blocking insulating layer.

In some embodiments according to the inventive concept, a non-volatile memory device can include a plurality of gate structures on active regions of a substrate each having impurity regions associated in the substrate. A plurality of isolation regions can be in trenches in the substrate that separate the impurity regions from one another. An oxide liner layer can be in the trenches and a low K dielectric structure can be in the trenches on the oxide liner layer which can be selected to reduce interference between adjacent ones of the impurity regions.

In some embodiments according to the inventive concept, the device can further include an interlayer insulating layer above the low K dielectric structure bridging openings in the trenches. In some embodiments according to the inventive concept, the low K dielectric structure can be a carbon-containing silicon oxide layer that partially fills the trenches to provide an air-gap between an uppermost surface of the carbon-containing silicon oxide layer and portions of the interlayer insulating layer bridge the trenches.

In some embodiments according to the inventive concept, the carbon-containing silicon oxide layer can be a porous heat-treated carbon-containing silicon oxide layer having a reduced carbon component constituent. In some embodiments according to the inventive concept, the low K dielectric structure can be a carbon-containing silicon oxide layer that completely fills the trenches beneath portions of the interlayer insulating layer bridging the trenches.

In some embodiments according to the inventive concept, the device can further include a closing insulating layer on a sidewall of at least one of the gate structures, that bridges openings in the trenches. In some embodiments according to the inventive concept, the low K dielectric structure can be a carbon-containing silicon oxide layer that completely fills the trenches beneath portions of the closing insulating layer bridging the trenches. In some embodiments according to the inventive concept, wherein the low-k dielectric material can be a material selected from a group consisting of hydrogen silsesquioxane (HSQ), methyl silsesquioxane (MSQ), amorphous fluoro-carbon (a-C:F), fluorinated silicon oxide (SiOF), silicon oxycarbide (SiOC), and porous SiO2, or combinations thereof.

DETAILED DESCRIPTION OF EMBODIMENTS ACCORDING TO THE INVENTIVE CONCEPT

Figure 1:
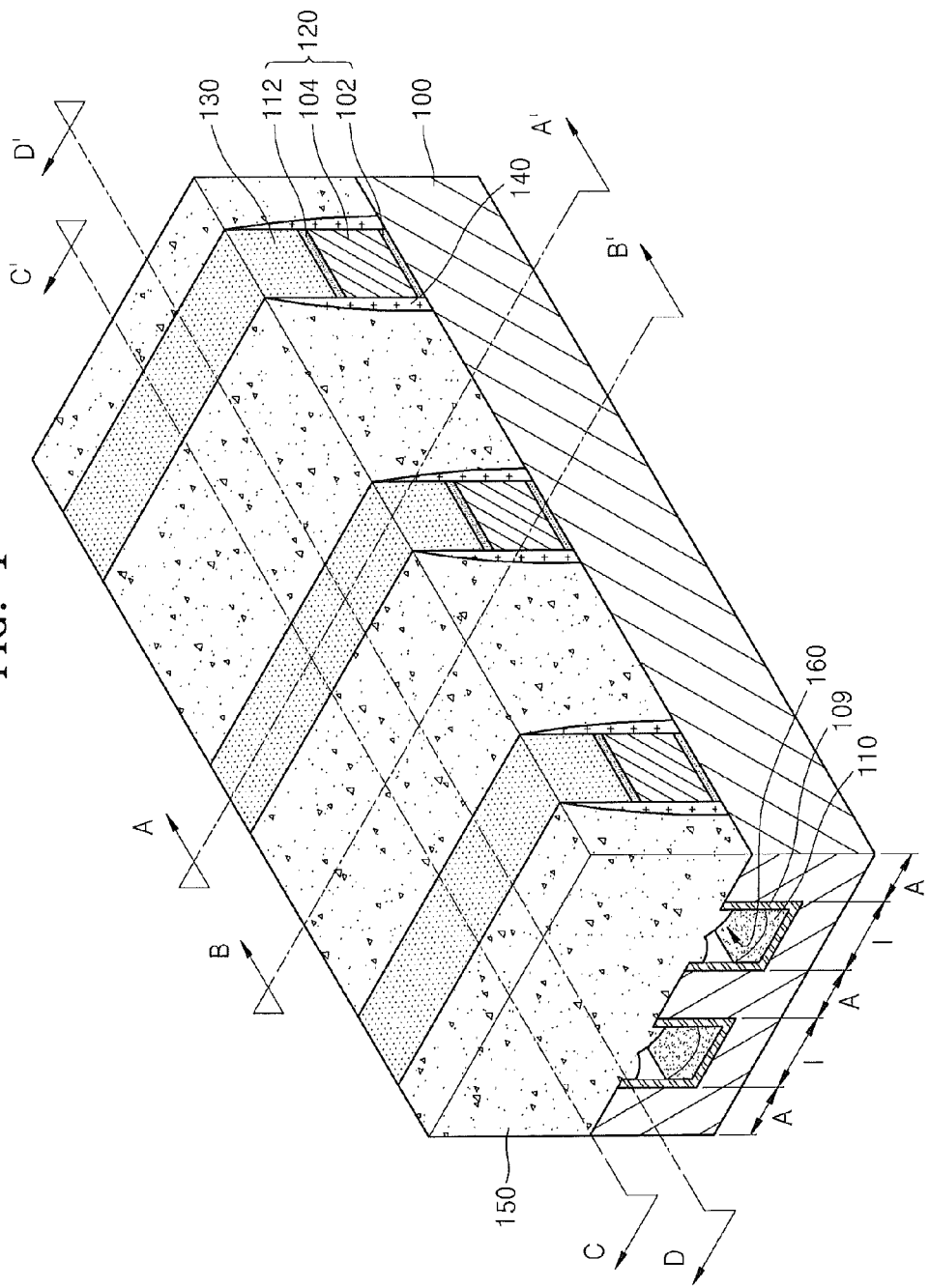
FIG. 1 is a perspective view of a non-volatile memory device, according to an embodiment of the inventive concept.

Hereinafter, embodiment of the inventive concept will be described more fully with reference to the accompanying drawings.

The inventive concept may, however, be embodied in many different forms and should not be construed as being limited to the embodiments set forth herein; rather, these embodiments are provided so that this disclosure will be thorough and complete, and will fully convey the concept of the invention to those skilled in the art.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that, although the terms first, second, third, etc., may be used herein to describe various elements, regions, and/or sections, these elements, regions, and/or sections should not be limited by these terms. These terms do not mean specific order, level, or superiority and are only used to distinguish one element, region, or section from another element, region, or section. Thus, a first element, region, or section discussed below could be termed a second element, region, or section without departing from the teachings of exemplary embodiments.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing.

It will be understood that the term "air gap" includes structures where a material layer is left unformed (compared to an immediately adjacent area to the gap where the material layer may be formed) to provide an absence of the material, which may provide reduced capacitive coupling between adjacent channels by, for example, reducing the dielectric value of the material located between the adjacent channels. The term "air gap" can also include structures where the material layer that is unformed is occupied by a gas, such as air, or other types of gas. Moreover, the "air gap" may be occupied by a relatively low K dielectric material which provide reduced capacitive coupling between adjacent channels.

FIG. 1 is a perspective view of a non-volatile memory device, according to an embodiment of the inventive concept.

Referring to FIG. 1, the non-volatile memory device may include a substrate 100, a liner oxide layer 109, a carbon-containing silicon oxide layer 110, a gate insulating layer 120, a gate conductive layer 130, a spacer 140, and an interlayer insulating layer 150.

The substrate 100 may be a semiconductor substrate and may include, for example, silicon, a silicon-on-insulator, silicon-on-sapphire, germanium, silicon-germanium, or gallium-arsenide. Active regions A of the substrate 100 are defined by device isolation regions I. The gate insulating layer 120 and the gate conductive layer 130 may be formed on the active regions A.

The liner oxide layer 109 is formed within the device isolation regions I and is formed to contact the substrate 100. More specifically, the liner oxide layer 109 may be formed to contact the lower part and inner side walls of the substrate 100. Also, the liner oxide layer 109 may have a thickness of about 20% to about 70% of a critical dimension (CD) of the device isolation region I, that is, a width of the device isolation region I.

The liner oxide layer 109 may include a high-quality silicon oxide layer. Examples of the high-quality silicon oxide layer may include a high temperature oxide (HTO) layer formed by using high temperature oxidization using $SiH_2Cl_2$ and $H_2O$ gas having excellent internal pressure and time dependent dielectric breakdown (TDDB) characteristic as a source gas. However, the inventive concept is not limited thereto.

The carbon-containing silicon oxide layer 110 may be formed on the lower part of the device isolation region I. More specifically, the carbon-containing silicon oxide layer 110 may be formed to contact the lower part and inner side walls of the liner oxide layer 109. The upper surface of the carbon-containing silicon oxide layer 110 may be lower than (i.e., separated from) the upper surface of the active region A. Also, the carbon-containing silicon oxide layer 110 may be a carbon-doped silicon oxide layer.

The carbon-containing silicon oxide layer 110 may further include hydrogen or may be a hydrogen-contained silicon oxide layer without carbon. In other words, according to the inventive concept, an insulating layer existing in the device isolation region I may include any material having a porous characteristic obtained after a method of applying energy or ashing is performed. Accordingly, in the current embodiment of the inventive concept, the carbon-containing silicon oxide layer 110 is illustrated as an exemplary material.

The gate insulating layer 120 may include a tunneling insulating layer 102, a charge storage layer 104, and a blocking insulating layer 112. The tunneling insulating layer 102 may be formed of any one material selected from the group consisting of a silicon oxide ($SiO_2$), silicon nitride ($Si_3N_4$), silicon oxynitride (SiON), a hafnium oxide ($HfO_2$), a hafnium silicon oxide ($HfSi_xO_y$), an aluminum oxide ($Al_2O_3$), and a zirconium oxide ($ZrO_2$), or may be formed by stacking a plurality of layers including combinations of the materials.

The charge storage layer 104 stores data of the non-volatile memory device and is disposed on the tunneling insulating layer 102. In a charge trap flash mode, the charge storage layer 104 may include a silicon nitride layer. Also, in a floating gate mode, the charge storage layer 104 may include impurity-doped polysilicon.

The blocking insulating layer 112 prevents a charge stored in the charge storage layer 104 from leaking to the gate conductive layer 130. The blocking insulating layer 112 may have a structure in which a lower dielectric layer, a high-k dielectric layer, and an upper dielectric layer are sequentially stacked.

For example, the lower dielectric layer and the upper dielectric layer may each include a silicon oxide layer. When the lower dielectric layer and the upper dielectric layer are each a silicon oxide layer, the lower dielectric layer and the upper dielectric layer may have the same material and structure and may each be a single layer including any one or more materials selected from the group consisting of $SiO_2$, carbon-doped $SiO_2$, fluorine-doped $SiO_2$, and porous $SiO_2$.

The high-k dielectric layer may be a silicon nitride layer or a metal oxide layer having higher permittivity than that of a silicon nitride layer. The metal oxide layer may be formed of any one material selected from the group consisting of aluminum oxide ($Al_2O_3$), a tantalum oxide ($Ta_2O_3$), a titanium oxide ($TiO_2$), a yttrium oxide ($Y_2O_3$), a zirconium oxide ($ZrO_2$), a zirconium silicon oxide ($ZrSi_xO_y$), a hafnium oxide ($HfO_2$), a hafnium silicon oxide ($HfSi_xO_y$), a lanthanum oxide ($La_2O_3$), a lanthanum aluminum oxide (LaAlO), a lanthanum hafnium oxide (LaHfO), a hafnium aluminum oxide (HfAlO), and a praseodymium oxide ($Pr_2O_3$), or may be formed by stacking a plurality of layers including combinations of the materials.

The gate conductive layer 130 is formed on the gate insulating layer 120, and more specifically, on the blocking insulating layer 112. The gate conductive layer 130 may include impurity-doped polysilicon, a metal, a metal silicide metal, and combinations thereof. More specifically, the gate conductive layer 130 may be formed of any one material selected from the group consisting of polysilicon, a metal, metal nitride, and metal silicide, or may be formed by stacking a plurality of layers including combinations of the materials.

The spacer 140 may be formed on the gate conductive layer 130 and sidewalls of the gate insulating layer 120, that is, sidewalls of a word line. The spacer 140 and the interlayer insulating layer 150 may each include a silicon oxide layer.

The interlayer insulating layer 150 may be formed to cover the gate insulating layer 120 and the gate conductive layer 130. The interlayer insulating layer 150 may include a material having low step coverage. The material may include, for example, tetraethylorthosilicate glass ($O_3$-TEOS) or undoped silicate glass (USG).

Figure 2:
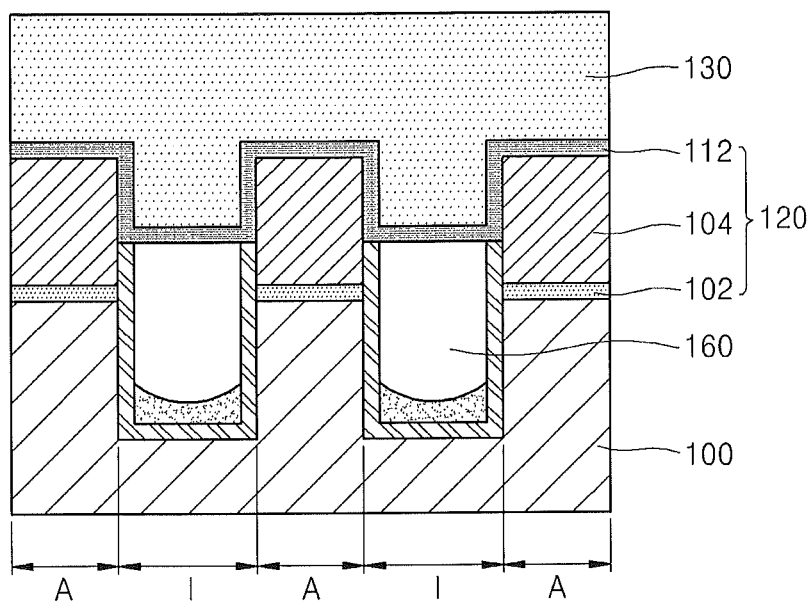
FIG. 2 is a cross-sectional view of the non-volatile memory device of FIG. 1 cut along a line A-A' of FIG. 1.
Figure 3:
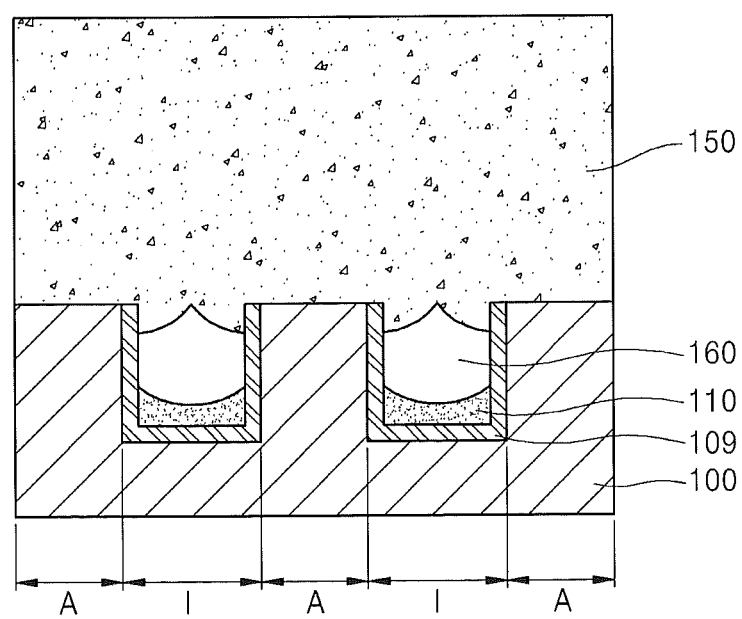
FIG. 3 is a cross-sectional view of the non-volatile memory device of FIG. 1 cut along a line B-B' of FIG. 1.
Figure 4:
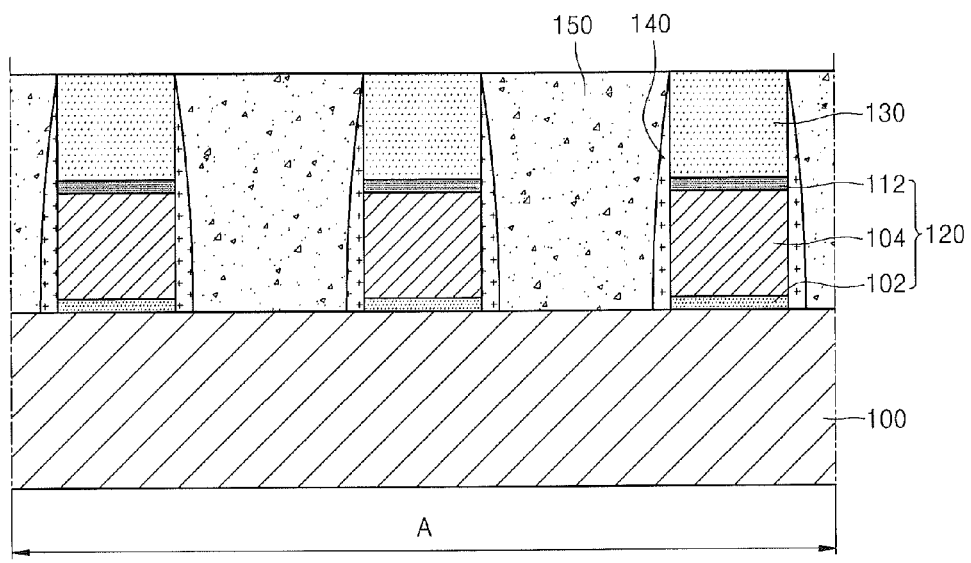
FIG. 4 is a cross-sectional view of the non-volatile memory device of FIG. 1 cut along a line C-C' of FIG. 1.
Figure 5:
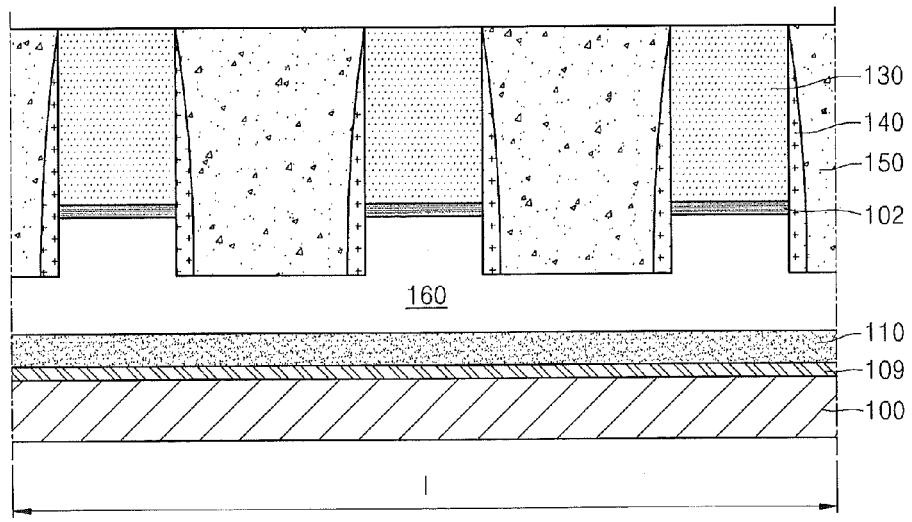
FIG. 5 is a cross-sectional view of the non-volatile memory device of FIG. 1 cut along a line D-D' of FIG. 1.

FIG. 2 is a cross-sectional view of the non-volatile memory device of FIG. 1 cut along a line A-A' of FIG. 1, FIG. 3 is a cross-sectional view of the non-volatile memory device of FIG. 1 cut along a line B-B' of FIG. 1, FIG. 4 is a cross-sectional view of the non-volatile memory device of FIG. 1 cut along a line C-C' of FIG. 1, and FIG. 5 is a cross-sectional view of the non-volatile memory device of FIG. 1 cut along a line D-D' of FIG. 1.

Referring to FIG. 2, an air gap 160 may be formed between the carbon-containing silicon oxide layer 110 and the gate insulating layer 120, in particular, between the carbon-containing silicon oxide layer 110 and the blocking insulating layer 112. The air gap 160 has low capacitance and thus may reduce interference effects between channels. In order to form the air gap 160, the carbon-containing silicon oxide layer 110 may be wet-etched after a gate structure is formed.

Referring to FIG. 3, the air gap 160 is formed between the interlayer insulating layer 150 and the carbon-containing silicon oxide layer 110. After the interlayer insulating layer 150 having low step coverage is deposited, the air gap 160 may be formed.

Referring to FIG. 4, a flash memory cell structure, in which the tunneling insulating layer 102, the charge storage layer 104, the blocking insulating layer 112, and the gate conductive layer 130 are sequentially stacked on the active region A, is formed. Referring to FIG. 5, the air gap 160 is formed on the device isolation region I.

FIGS. 6 through 14 are perspective views illustrating methods of manufacturing non-volatile memory devices, according to embodiments of the inventive concept.

Figure 6:
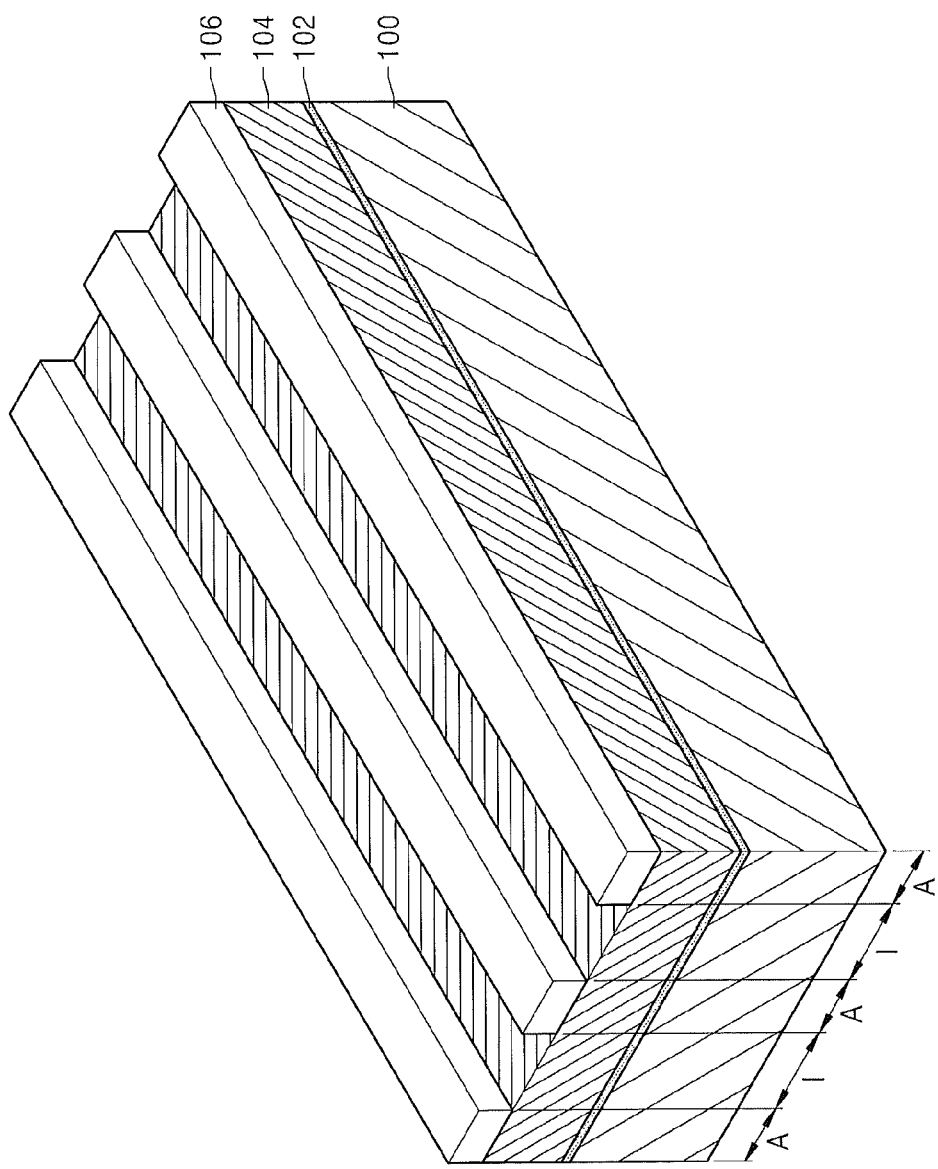
FIGS. 6 through 14 are perspective views illustrating methods of manufacturing non-volatile memory devices, according to embodiments of the inventive concept.

Referring to FIG. 6, the tunneling insulating layer 102 is formed on the substrate 100. Then, the charge storage layer 104 is formed on the tunneling insulating layer 102. In a floating gate mode, the charge storage layer 104 may include impurity-doped polysilicon. More specifically, the charge storage layer 104 is formed by depositing polysilicon on the tunneling insulating layer 102 by using chemical vapor deposition (CVD), for example, low pressure chemical vapor deposition (LPCVD) using $SiH_4$ or $Si_2H_6$ and $PH_3$ gas and then by doping impurity on the polysilicon.

In addition, in a charge trap flash mode, the charge storage layer 104 may include a silicon nitride layer. In this case, silicon nitride is deposited on the tunneling insulating layer 102 by using CVD, for example, LPCVD using $SiH_2Cl_2$ and $NH_3$ and thereby, the silicon nitride layer may be formed.

A first hard mask layer is formed on the charge storage layer 104. The first hard mask layer may include a material having etch selectivity with respect to the charge storage layer 104, the tunneling insulating layer 102, and the substrate 100. For example, the first hard mask layer may include silicon nitride or silicon oxynitride.

A first photoresist layer is coated on the first hard mask layer and the first photoresist layer is exposed and developed. Accordingly, a first photoresist pattern is formed on the first hard mask layer. The first photoresist pattern may be formed to selectively cover or expose portions corresponding to the active regions A on the substrate 100. More specifically, the first photoresist pattern may have a lined structure extended in a first direction and may be repeatedly formed.

The first hard mask layer is etched by using the first photoresist pattern as an etching mask, thereby forming first hard mask patterns 106. Then, the first photoresist pattern may be removed through ashing and/or stripping.

Figure 7:
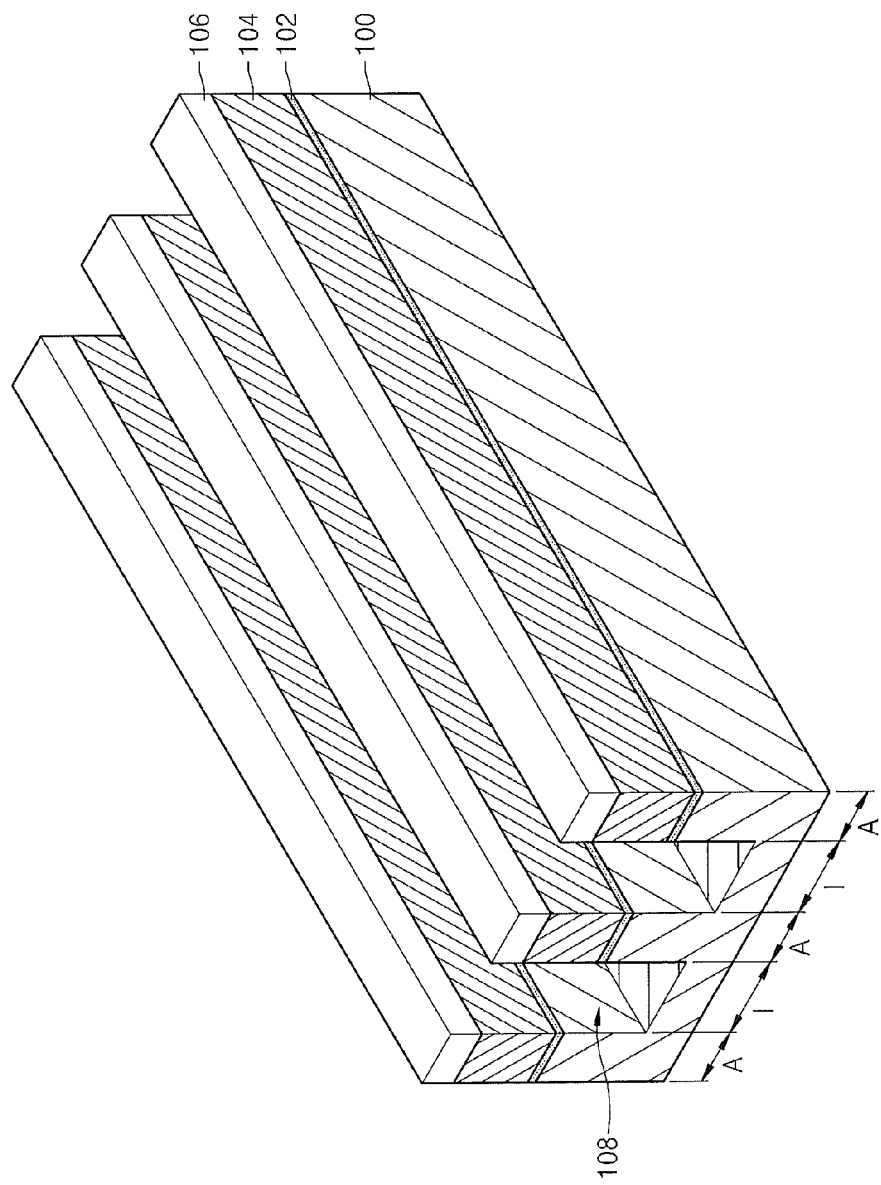

Referring to FIG. 7, the charge storage layer 104 and the tunneling insulating layer 102 are etched by using the first hard mask patterns 106 as etching masks. Then, predetermined areas of the substrate 100 exposed through the charge storage layer 104 are etched to form trenches 108 in the substrate 100. The device isolation regions I of the semiconductor device are defined by the trenches 108 and the active regions A of the substrate 100 are defined by the device isolation regions I.

Figure 8:
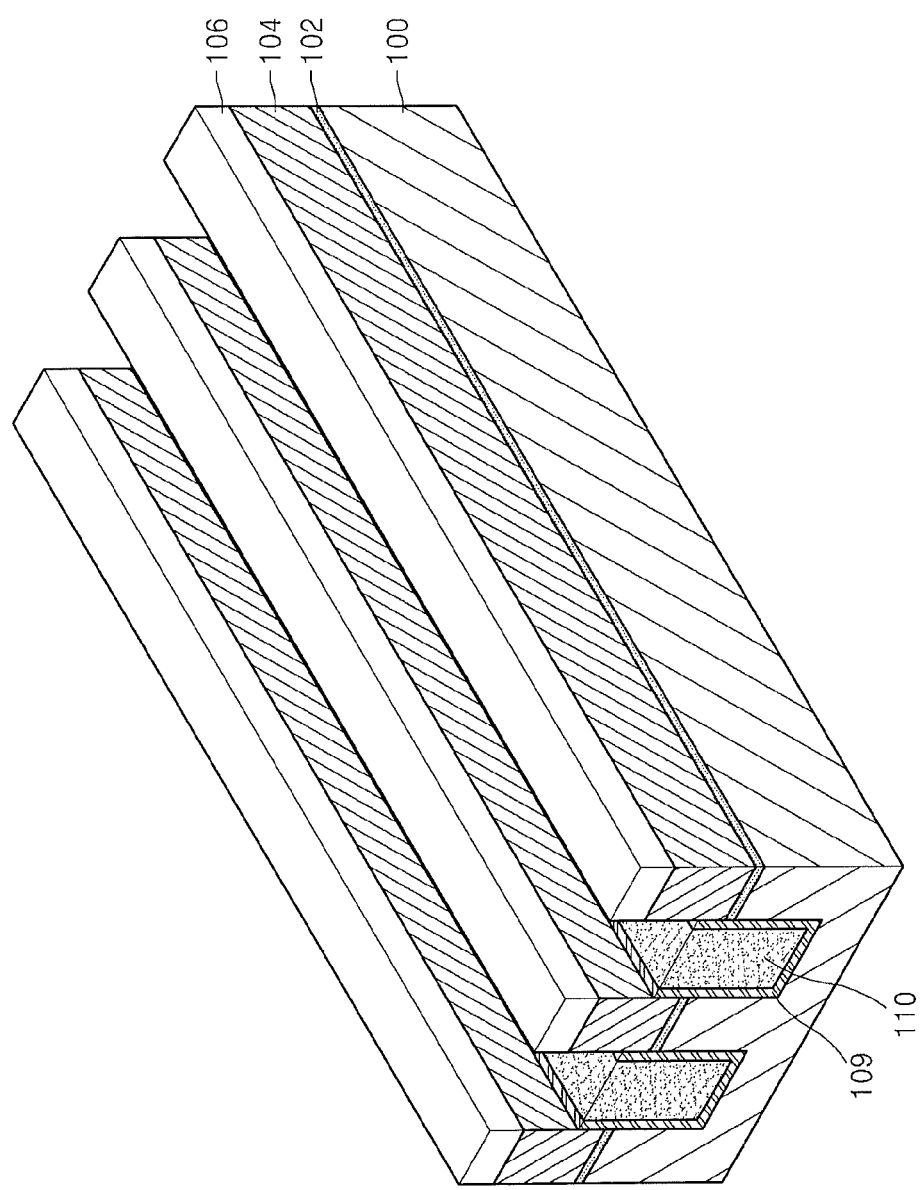

Referring to FIG. 8, the liner oxide layers 109 are formed at the bottoms and on the inner sidewalls of the trenches 108 and the carbon-containing silicon oxide layer 110 completely fills in the trenches 108. More specifically, the liner oxide layers 109 may be formed at the bottoms and on the inner sidewalls of the trenches 108 by injecting oxygen or vapor at a temperature of about 800 to about 1200° C. and by heating. Also, the liner oxide layers 109 may be deposited within the trenches 108 by using LPCVD or atomic layer deposition (ALD).

The carbon-containing silicon oxide layer 110 is formed on the liner oxide layer 109. The carbon-containing silicon oxide layer 110 may be formed to fill the trenches 108 by using, for example, CVD. The carbon-containing silicon oxide layer 110 may be formed by injecting octamethylcyclotetrasiloxane (OMCTS), tetraethly orthosilicate (TEOS), or tetramethoxyl silane (TMOS), as a precursor, along with vapor, oxygen, and ozone gas and by heating at a temperature of about 100° C. or below.

The liner oxide layer 109 and the carbon-containing silicon oxide layer 110 are planarized. More specifically, the liner oxide layer 109 and the carbon-containing silicon oxide layer 110 may be planarized by using chemical mechanical polishing (CMP) using the first hard mask patterns 106 as a stopper.

The liner oxide layer 109 and the carbon-containing silicon oxide layer 110 are etched by a predetermined depth. In this case, the liner oxide layer 109 and the carbon-containing silicon oxide layer 110 may be etched by a predetermined depth by using reactive ion etching. As a result of the reactive ion etching, the upper surfaces of the liner oxide layer 109 and the carbon-containing silicon oxide layer 110 may be lower than the upper surface of the charge storage layer 104.

Figure 9:
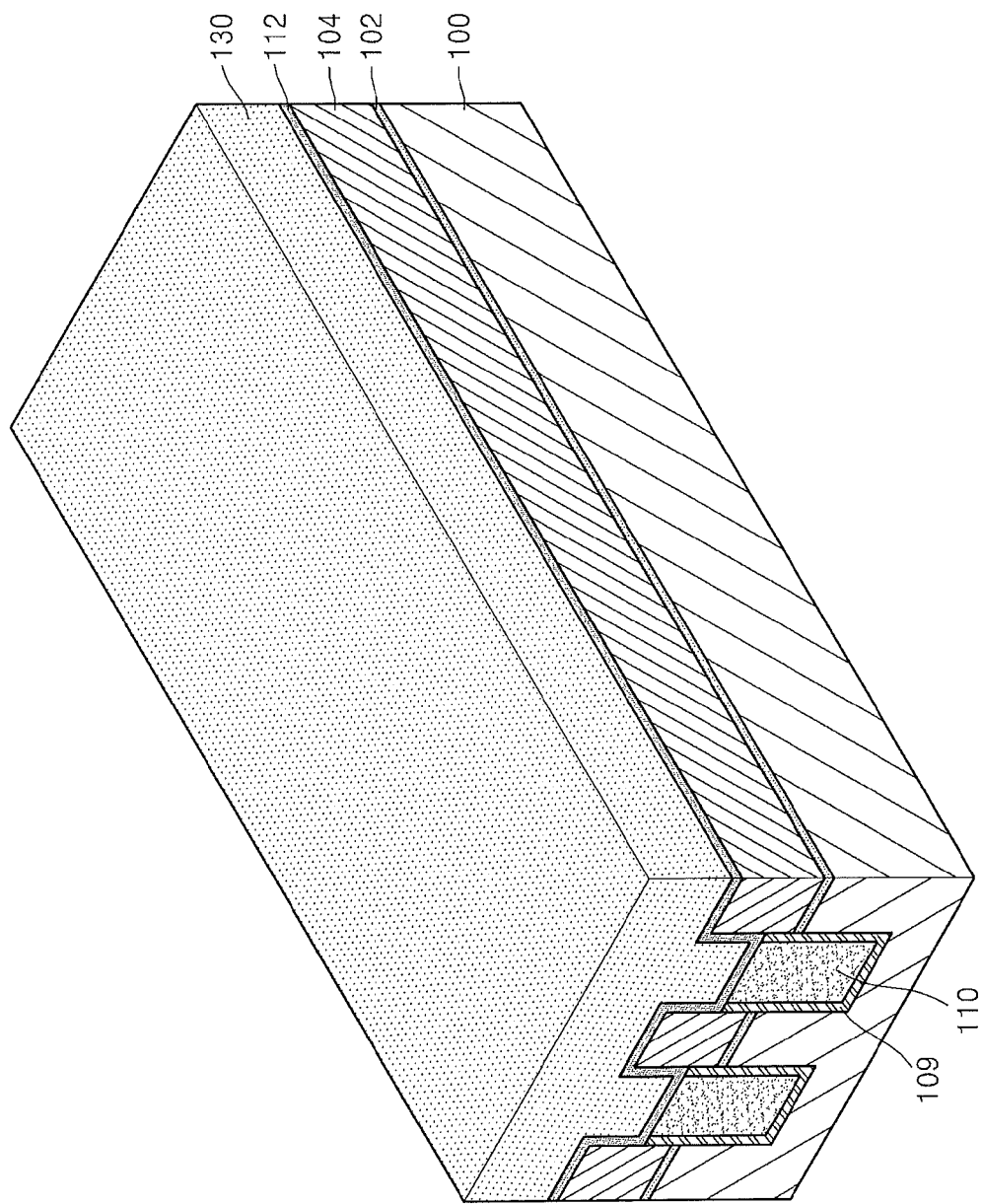

Referring to FIG. 9, the first hard mask patterns 106 are removed and the blocking insulating layer 112 is formed on the carbon-containing silicon oxide layer 110 and the charge storage layer 104. In order to form the blocking insulating layer 112, the lower dielectric layer, the high-k dielectric layer, and the upper dielectric layer may be sequentially stacked. Then, the gate conductive layer 130, as a control gate, is formed on the blocking insulating layer 112.

Figure 10:
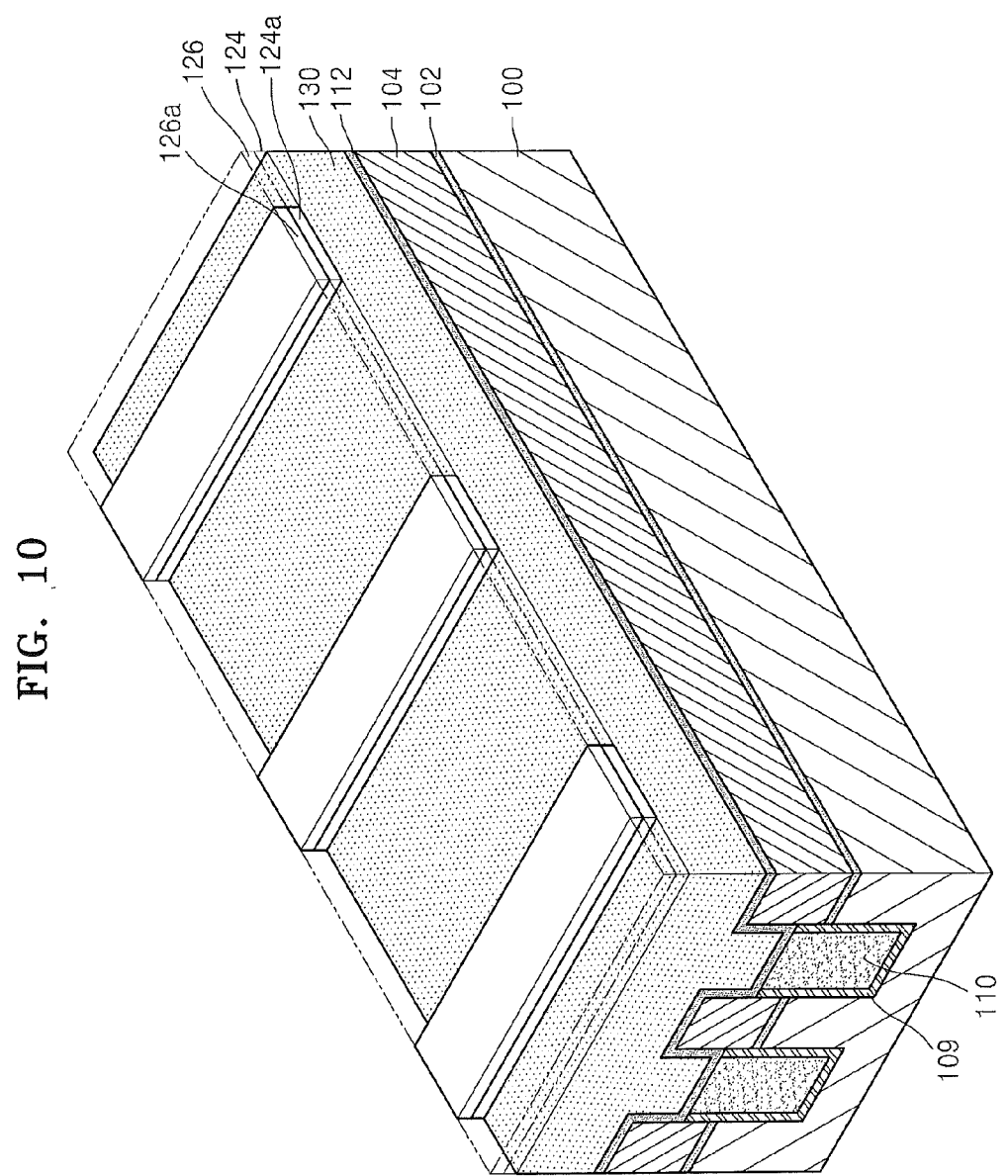

Referring to FIG. 10, a second hard mask layer 124 is formed on the gate conductive layer 130. The second hard mask layer 124 may include a material having etch selectivity with respect to the gate conductive layer 130. For example, the second hard mask layer 124 may include a silicon oxide, silicon nitride, or silicon oxynitride.

A second photoresist layer 126 is coated on the second hard mask layer 124. Then, the second photoresist layer 126 is exposed and developed such that second photoresist patterns 126a are formed on the second hard mask layer 124. The second photoresist patterns 126a selectively cover the second hard mask layer 124. More specifically, the second photoresist patterns 126a may each have a lined structure extended to a direction perpendicular to an extended direction of the charge storage layer 104. The second photoresist patterns 126a may have a repeated structure. The second hard mask layer 124 is etched by using the second photoresist patterns 126a as etching masks, thereby forming second hardmask patterns 124a.

Figure 11A:
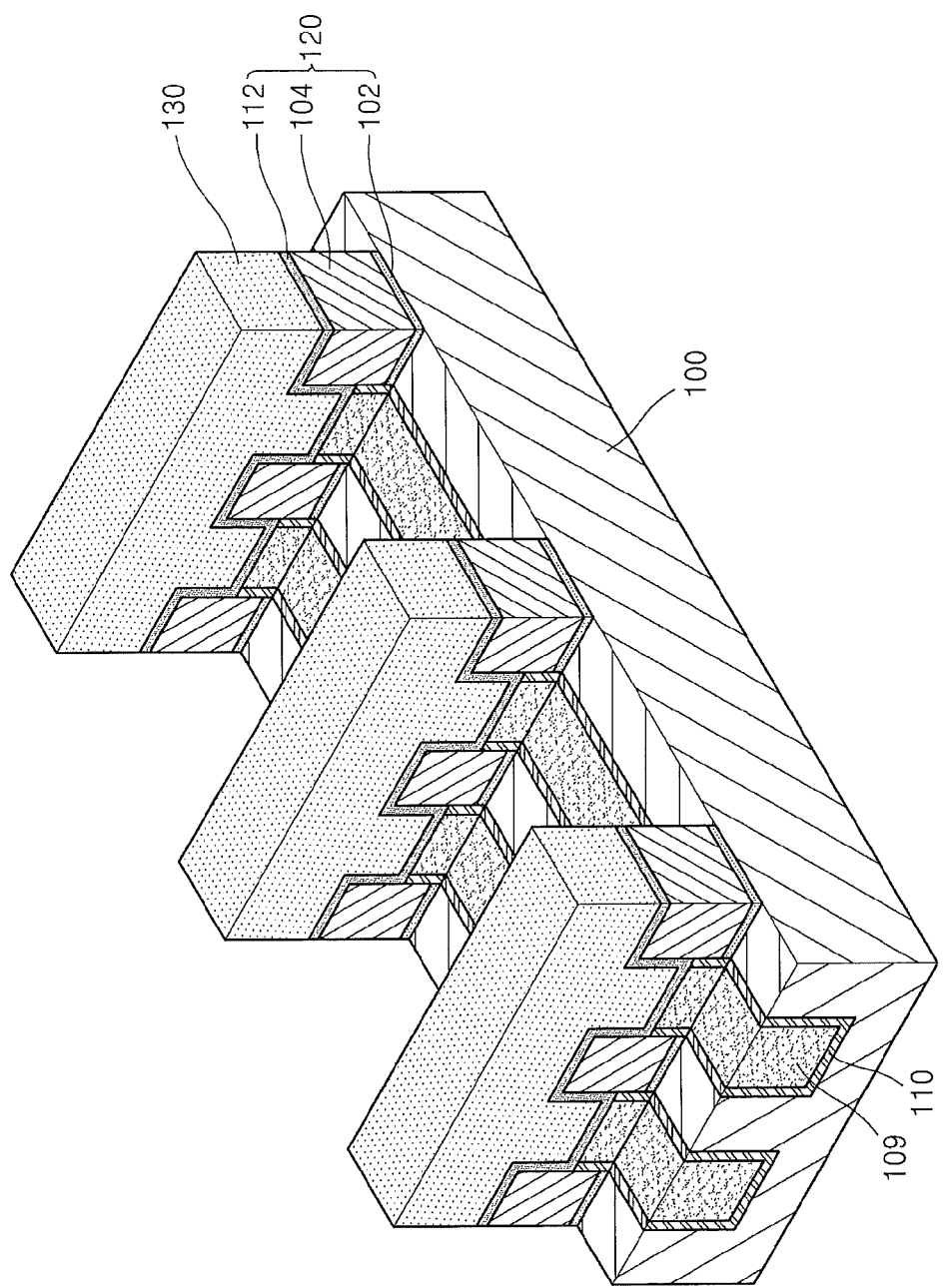
Figure 11B:
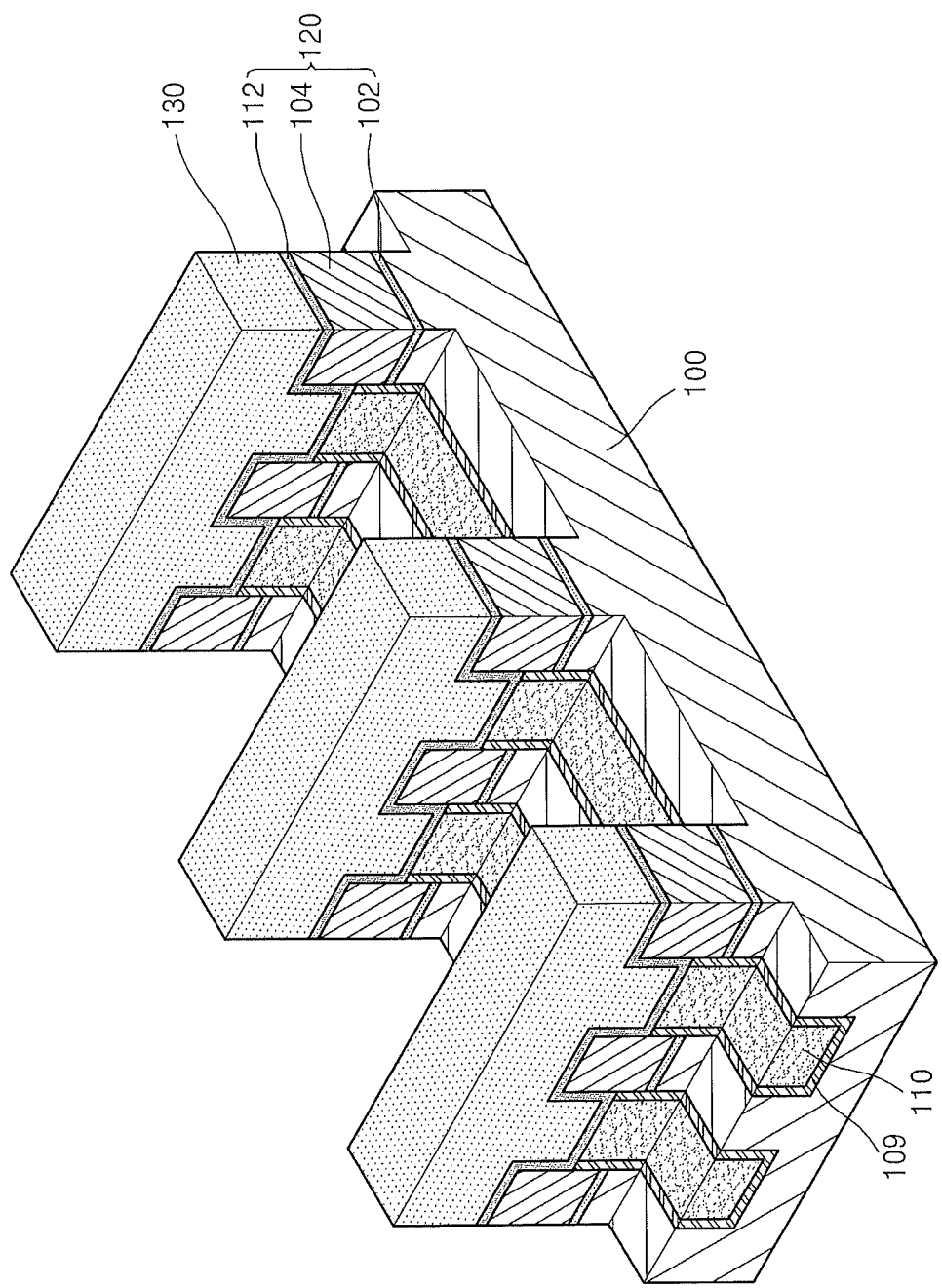

Referring to FIGS. 11A and 11B, the gate conductive layer 130, the blocking insulating layer 112, and the charge storage layer 104 are sequentially etched by using the second hard mask patterns 124a and the second photoresist patterns 126a as etching masks. The gate conductive layer 130, the blocking insulating layer 112, and the charge storage layer 104 may be etched until at least the upper surface of the substrate 100 on the active regions A is exposed. In this case, the upper surfaces of the carbon-containing silicon oxide layers 110 are also exposed. The gate conductive layer 130, the blocking insulating layer 112, and the charge storage layer 104 may be etched by using anisotropic etching using mixture gas of $CF_4$, $O_2$, HBr, and He, more specifically, reactive ion etching.

As illustrated in FIG. 11A, the gate conductive layer 130, the blocking insulating layer 112, and the charge storage layer 104 are sequentially etched to expose the upper surface of the substrate 100 by using the anisotropic etching so that the gate conductive layer 130 and the gate insulating layer 120 are formed. Optionally, as illustrated in FIG. 11B, the liner oxide layer 109 and the carbon-containing silicon oxide layer 110 are further etched by the anisotropic etching and thus may be recessed from the upper surface of the substrate 100. In this case, the upper surfaces of the liner oxide layer 109 and the carbon-containing silicon oxide layer 110 may be lower than the upper surface of the substrate 100 that contact the tunneling insulating layer 102 by 50 Å or above. Impurities are injected into the upper surface of the substrate 100 on both sides of the gate conductive layer 130 and the gate insulating layer 120, to a predetermined depth, thereby forming impurity areas.

Figure 12:
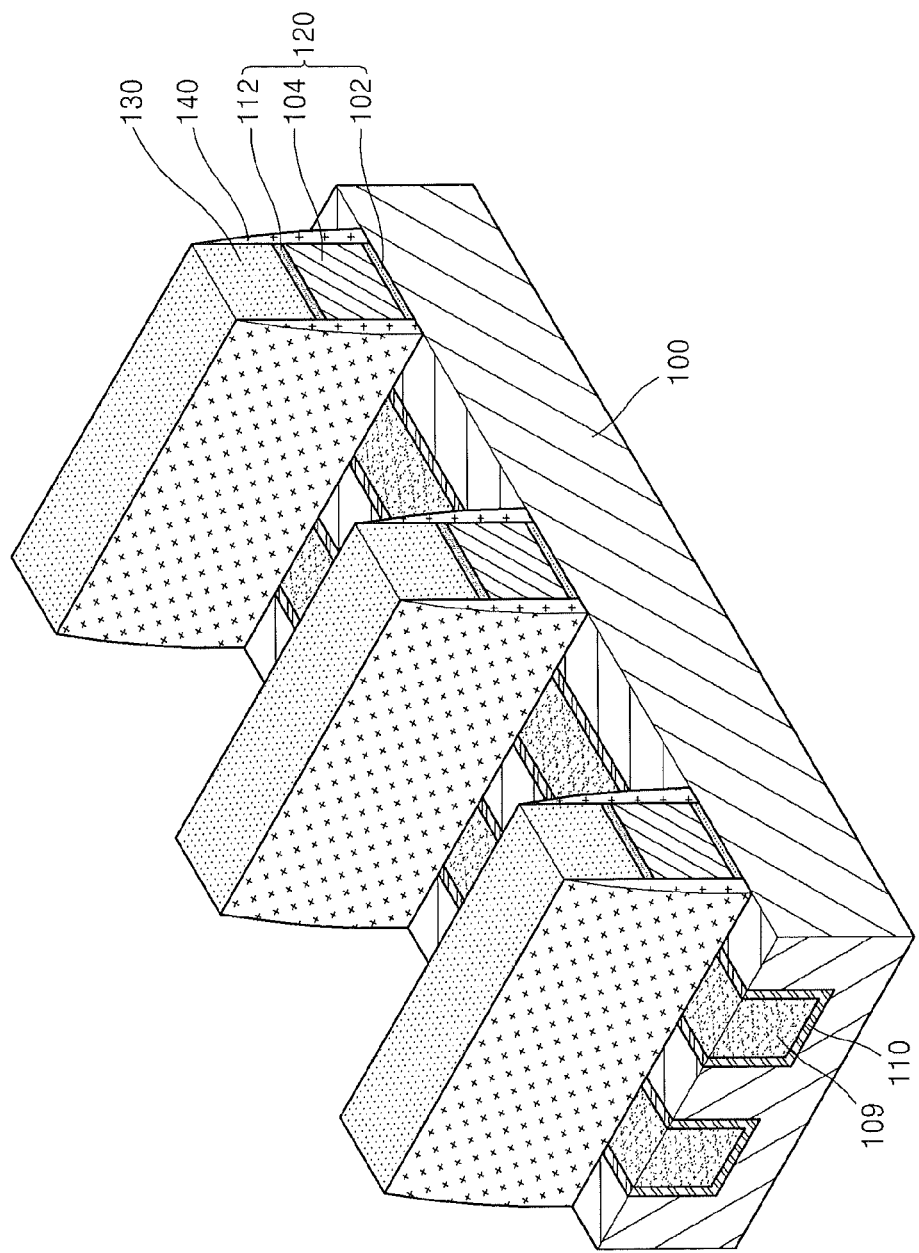

Referring to FIG. 12, the spacers 140 are formed on the sidewalls of the gate conductive layer 130 and the gate insulating layer 120, that is, sidewalls of the word line. The spacers 140 may prevent the gate insulating layer 120 from being damaged during wet etching. The spacers 140 may be formed of, for example, high temperature oxide (HTO).

A carbon component of the carbon-containing silicon oxide layer 110 is removed. More specifically, as the carbon component of the carbon-containing silicon oxide layer 110 is removed, the carbon-containing silicon oxide layer 110 may become porous. In order to remove some of the carbon in the carbon-containing silicon oxide layer 110, heat energy or optical energy may be applied to the carbon-containing silicon oxide layer 110. For example, high temperature heat treatment using oxygen, hydrogen, nitrogen, argon, carbon dioxide, and/or ammonia gas as a source gas is performed to remove some of the carbon component of the carbon-containing silicon oxide layer 110.

Optionally, optical energy such as ultraviolet (UV) beam may be applied to the carbon-containing silicon oxide layer 110 so as to smoothly remove some of the carbon component. The UV beam removes some of the carbon component of the carbon-containing silicon oxide layer 110 so as to make the carbon-containing silicon oxide layer 110 less dense. The UV beam may also make the liner oxide layer 109 denser.

Figure 13A:
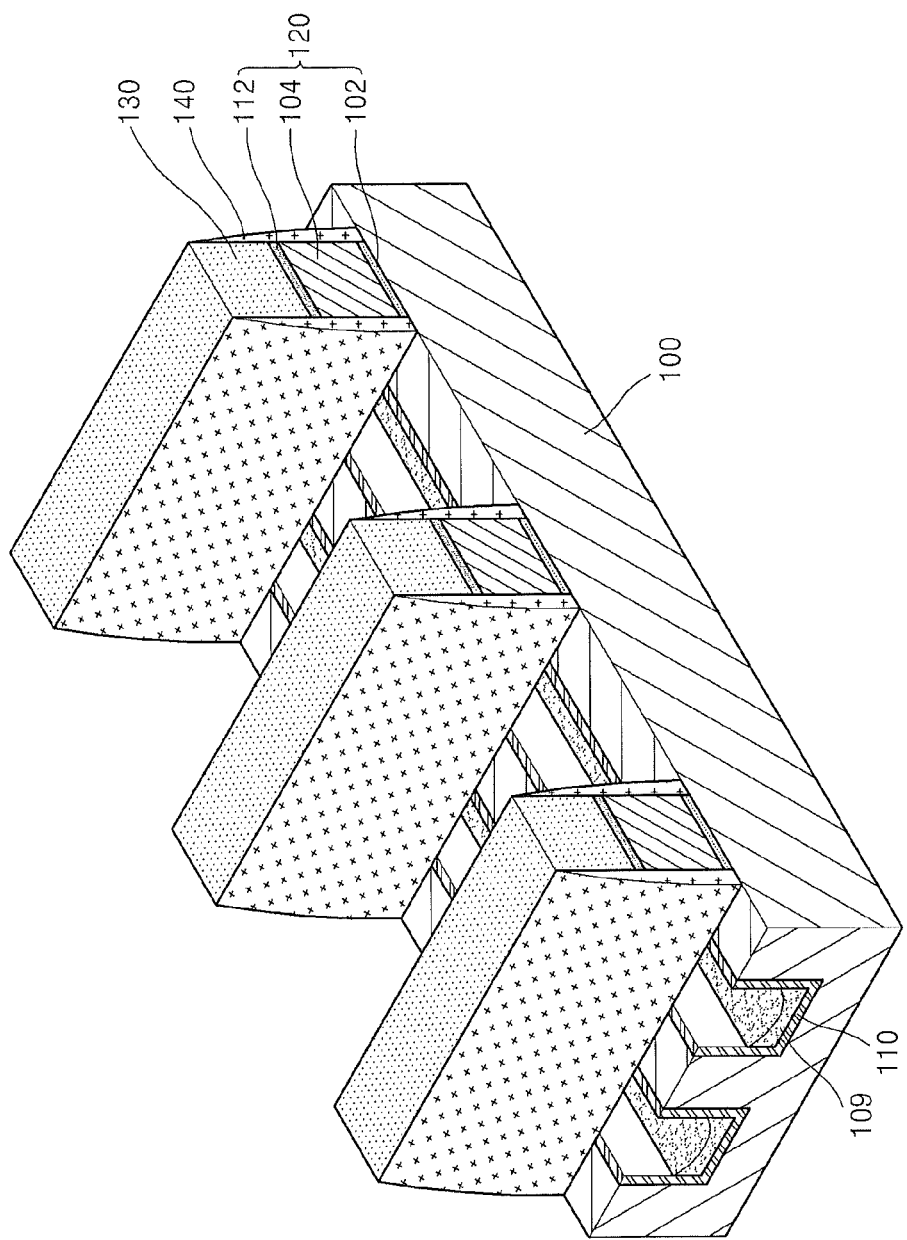
Figure 13B:
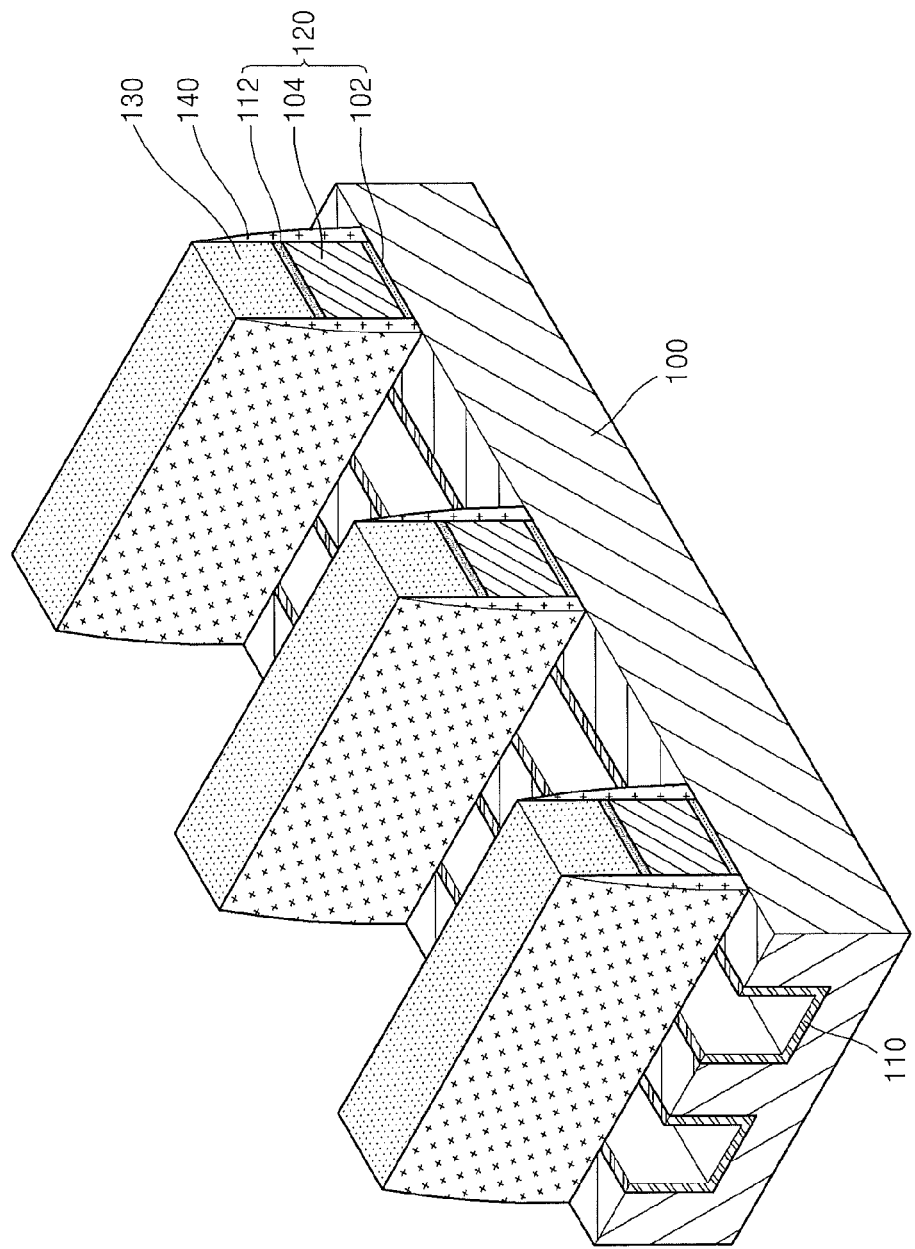

Referring to FIGS. 13A and 13B, the carbon-containing silicon oxide layer 110, through which the treatment may have been performed, is wet-etched. An etchant used to perform the wet etching may include any one selected from the group consisting of a hydrofluoric acid, a sulfuric acid, hydrogen peroxide, water vapor, and ozone gas, or combinations thereof.

Figure 15:
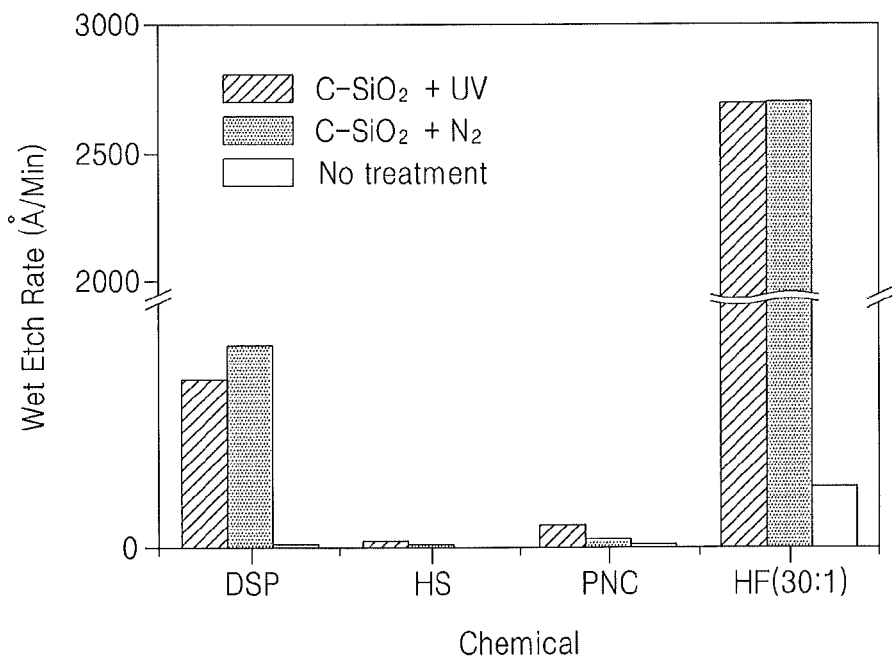
FIG. 15 is a graph showing etching speed of carbon-containing silicon oxide layer during wet-etching after a method of applying energy is applied.

FIG. 15 is a graph showing etching speed of the carbon-containing silicon oxide layer 110 during wet-etching as illustrated in FIGS. 13A and 13B after a method of applying energy is performed as the treatment method for the carbon-containing silicon oxide layer 110 as illustrated in FIG. 12.

Referring to FIG. 15, the carbon-containing silicon oxide layer 110 is wet etched by using dilute sulfuric peroxide (DSP) or a mixture solution of water and a hydrofluoric acid in a mixture ratio of 30:1. The carbon-containing silicon oxide layer 110 having a porous characteristic due to the heat energy and the optical energy is rapidly etched, subsequently. Consequently, the carbon-containing silicon oxide layer 110 is removed at rapid speed while the blocking insulating layer 112 and the tunneling insulating layer 102 are prevented by the spacers 140. Thus, the air gap 160 may be formed without damaging the entire memory device.

After the wet etching is performed, the carbon-containing silicon oxide layer 110 may partially exist (i.e., a remaining portion), as illustrated in FIG. 13A, or the carbon-containing silicon oxide layer 110 may be completely removed by the wet etching, as illustrated in FIG. 13B. Also, the air gap 160 may be formed between the blocking insulating layer 112 and the liner oxide layer 109 due to the wet etching. When the carbon-containing silicon oxide layer 110 partially exists, the air gap 160 is formed between the blocking insulating layer 112 and the carbon-containing silicon oxide layer 110.

Figure 14:
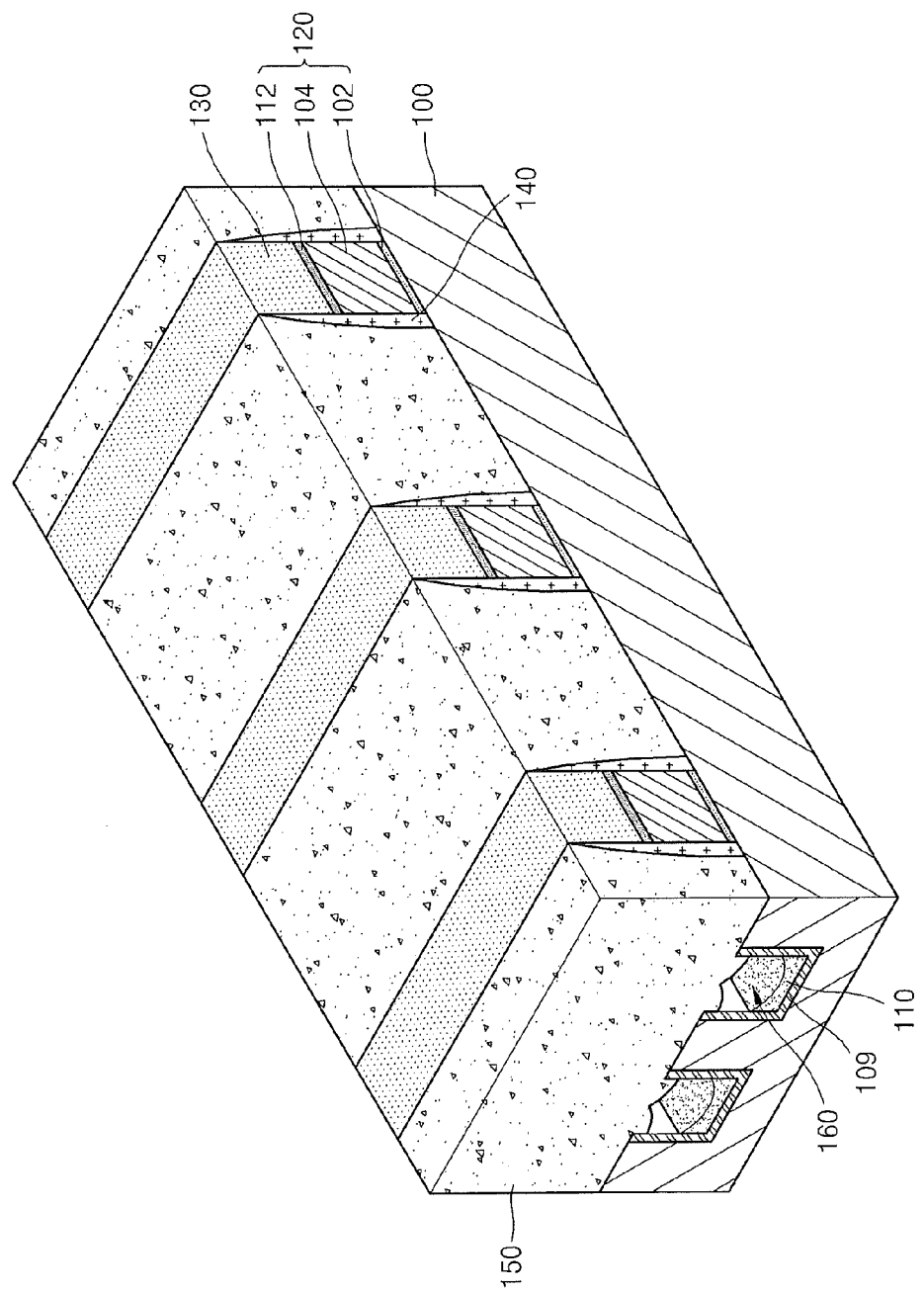

Referring to FIG. 14, the interlayer insulating layer 150 is formed to fill the gate insulating layer 120 and the gate conductive layer 130. In this case, the air gap 160 may be formed between the interlayer insulating layer 150 and the liner oxide layer 109. When the carbon-containing silicon oxide layer 110 partially exists, the air gap 160 is interposed between the interlayer insulating layer 150 and the carbon-containing silicon oxide layer 110. As described above, the interlayer insulating layer 150 may be formed of a material having low step coverage so that the air gap 160 is smoothly formed by depositing the interlayer insulating layer 150. Deposition speed of the interlayer insulating layer 150 and bias power and direction may be controlled so as for the interlayer insulating layer 150 to have low step coverage.

A low-k dielectric material may be formed between the carbon-containing silicon oxide layer 110 and the interlayer insulating layer 150 instead of the air gap 160. In this case, the low-k dielectric material may be formed on the carbon-containing silicon oxide layer 110 or the liner oxide layer 109, and the interlayer insulating layer 150 may be formed on the low-k dielectric material. The low-k dielectric material may include any one selected from the group consisting of hydrogen silsesquioxane (HSQ), methyl silsesquioxane (MSQ), amorphous fluoro-carbon (a-C:F), fluorinated silicon oxide (SiOF), silicon oxycarbide (SiOC), and porous SiO2, or combinations thereof.

Figure 16:
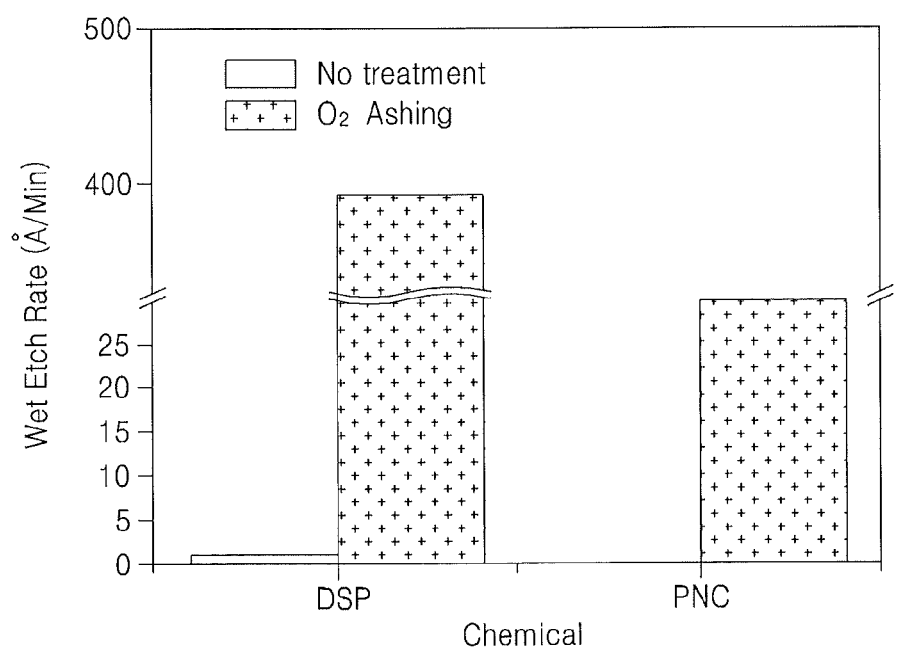
FIG. 16 is a graph showing etching speed of carbon-containing silicon oxide layer during wet-etching after aching is applied.

FIG. 16 is a graph showing etching speed of the carbon-containing silicon oxide layer 110 during wet-etching as illustrated in FIGS. 13A and 13B after an ashing process is performed as the treatment method for the carbon-containing silicon oxide layer 110 as illustrated in FIG. 12.

In order to remove the carbon component of the carbon-containing silicon oxide layer 110, an ashing process may be performed to the carbon-containing silicon oxide layer 110. For example, when the ashing process using oxygen gas as source gas is performed, the carbon component of the carbon-containing silicon oxide layer 110 is chemically combined to the oxygen gas and thereby the carbon component of the carbon-containing silicon oxide layer 110 may be removed.

Referring to FIG. 16, during wet etching of the carbon-containing silicon oxide layer 110, the carbon-containing silicon oxide layer 110 is etched by using DSP or plasma native oxide cleaning (PNC). The carbon-containing silicon oxide layer 110 in which the carbon component is removed in the ashing process and which has a porous characteristic is etched rapidly in the following etching process.

FIGS. 17 through 21 are perspective views illustrating a method of manufacturing a non-volatile memory device, according to another embodiment of the inventive concept.

The method of manufacturing a non-volatile memory device according to the current embodiment may be modified from the method of manufacturing a non-volatile memory device described with reference to FIGS. 6 through 14. In this regard, hereinafter, the same description of the method is not be repeated.

Figure 17:
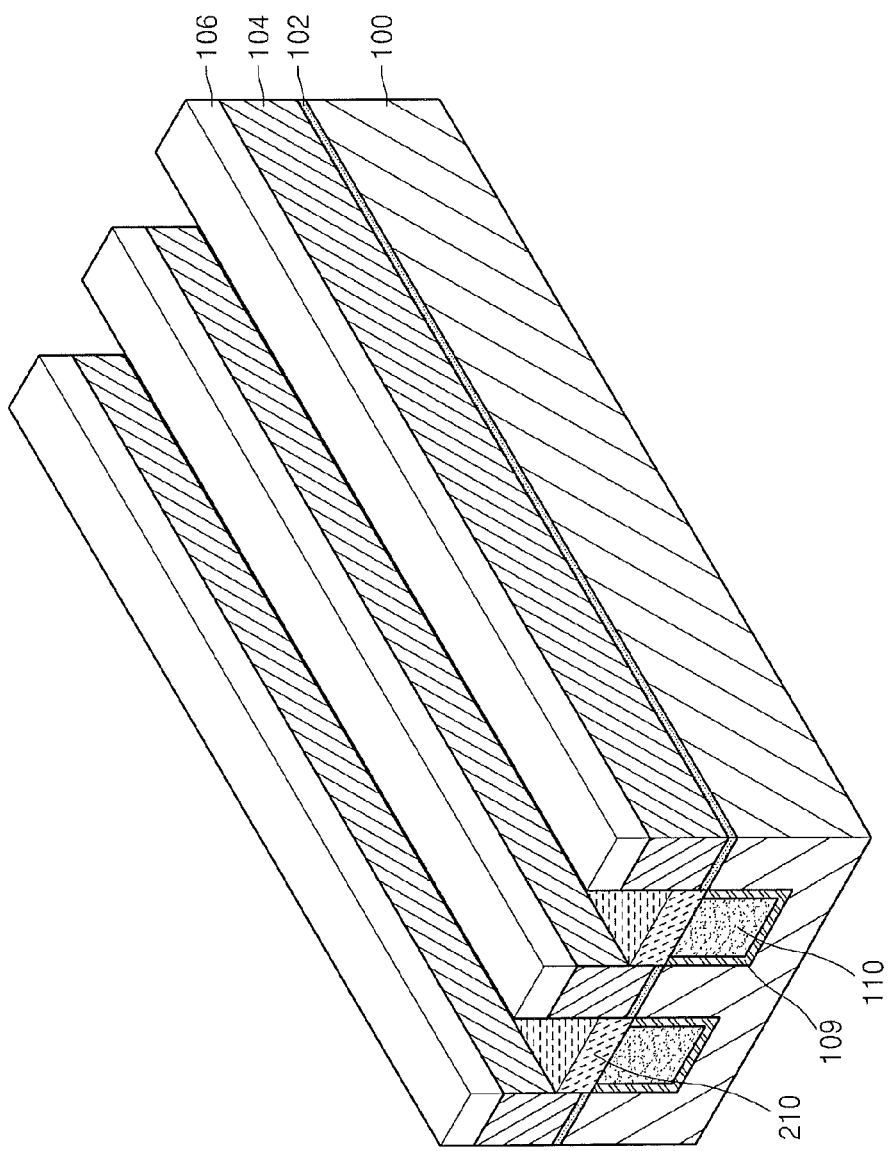
FIGS. 17 through 21 are perspective views illustrating methods of manufacturing non-volatile memory devices, according to embodiments of the inventive concept.

Referring to FIG. 17, the tunneling insulating layer 102 and the charge storage layer 104 are formed on the substrate 100 and the trenches 108 are formed by using first hard mask patterns 106, as illustrated in FIGS. 6 through 8. Then, the liner oxide layers 109 and the carbon-containing silicon oxide layers 110 are formed on a bottom of and on the inner sidewalls of each trench 108. Then, a planarization process and anisotropic etching are performed to the liner oxide layer 109 and the carbon-containing silicon oxide layer 110.

Next, a high-quality insulating layer 210 such as a high density plasma (HDP) oxide layer is formed on the liner oxide layer 109 and the carbon-containing silicon oxide layer 110. In order to form the insulating layer 210, an insulating material is filled in the trench 108 by using HDP-CVD, and etch-back or CMP may be performed for the insulating material. The insulating layer 210 is a high-quality thin layer and may prevent a charge in the charge storage layer 104 from being trapped to the device isolation region I.

Figure 18:
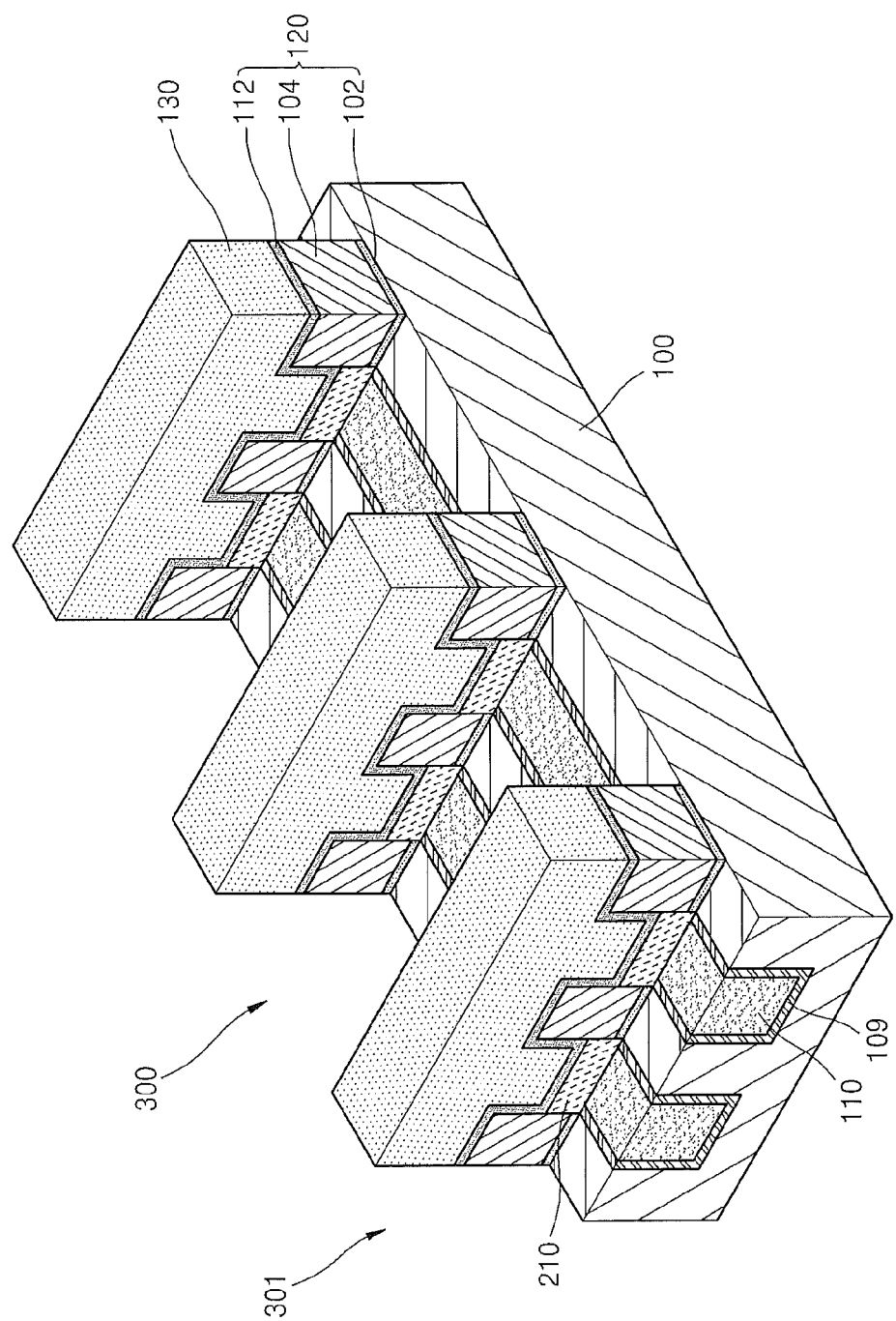

Referring to FIG. 18, the blocking insulating layer 112 and the gate conductive layer 130 are sequentially formed, as illustrated in FIGS. 9 through 11A. Then, the gate conductive layer 130, the blocking insulating layer 112, the charge storage layer 104, and the insulating layer 210 are anisotropic-etched so as to expose the upper surface of the carbon-containing silicon oxide layer 110. In the anisotropic etching, the second hard mask patterns 124a of FIG. 19 extended in a direction perpendicular to an extended direction of the carbon-containing silicon oxide layer 110 may be used as etching masks. Also, in the anisotropic etching, a plurality of recess units 300 may be formed.

Figure 19:
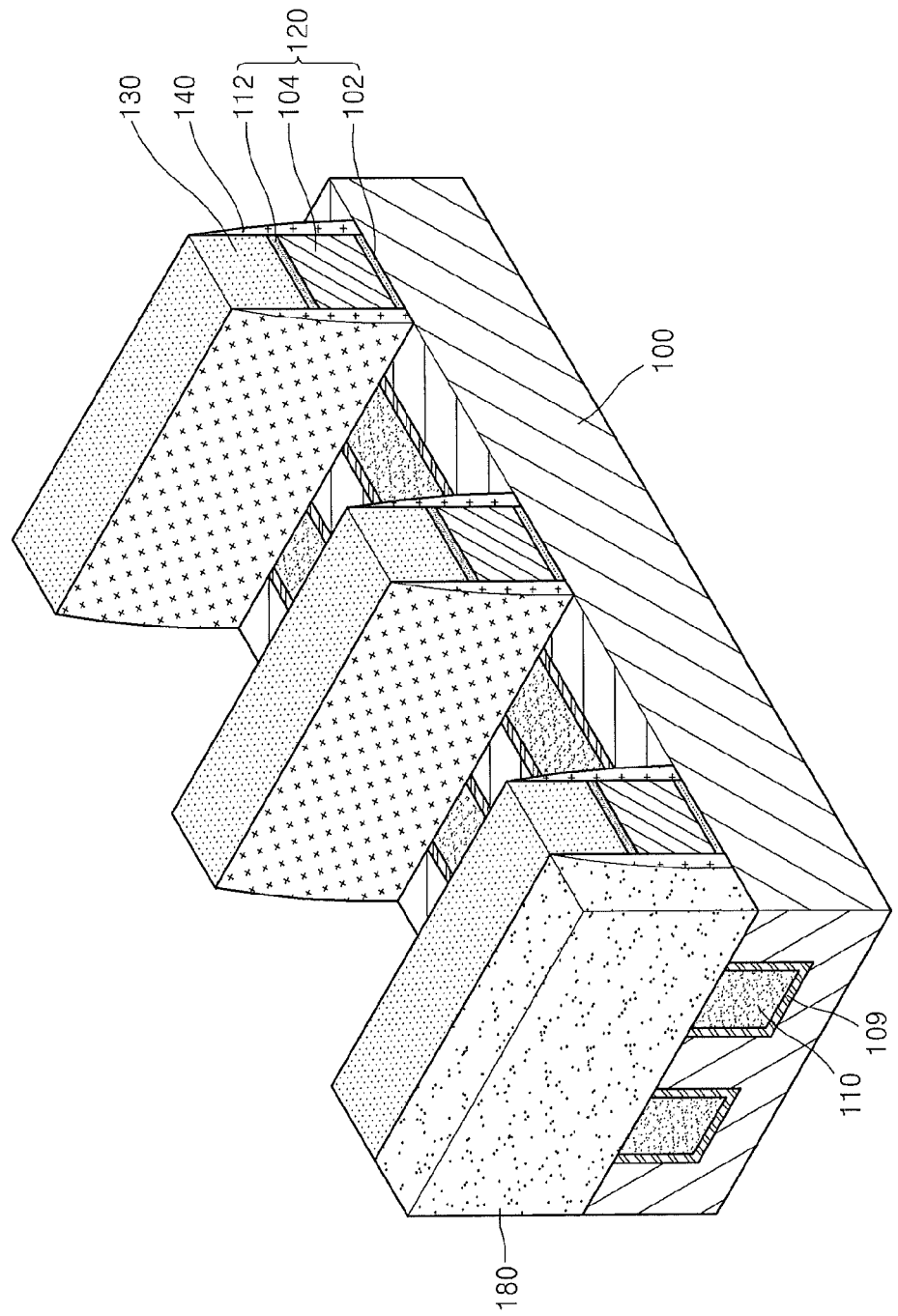

Referring to FIG. 19, the spacers 140 are formed on the sidewalls of the gate conductive layer 130 and the gate insulating layer 120, that is, sidewalls of the word line, as illustrated in FIG. 12, and the carbon component of the carbon-containing silicon oxide layer 110 is removed. That is, the carbon-containing silicon oxide layer 110 may be treated so as to have a porous characteristic.

Before the treatment, at least one of the plurality of recess units 300 may be filled by a closing insulating layer 180. In this case, although the treatment is performed, the carbon component of the carbon-containing silicon oxide layer 110 disposed below the closing insulating layer 180 may not be removed.

Figure 27:
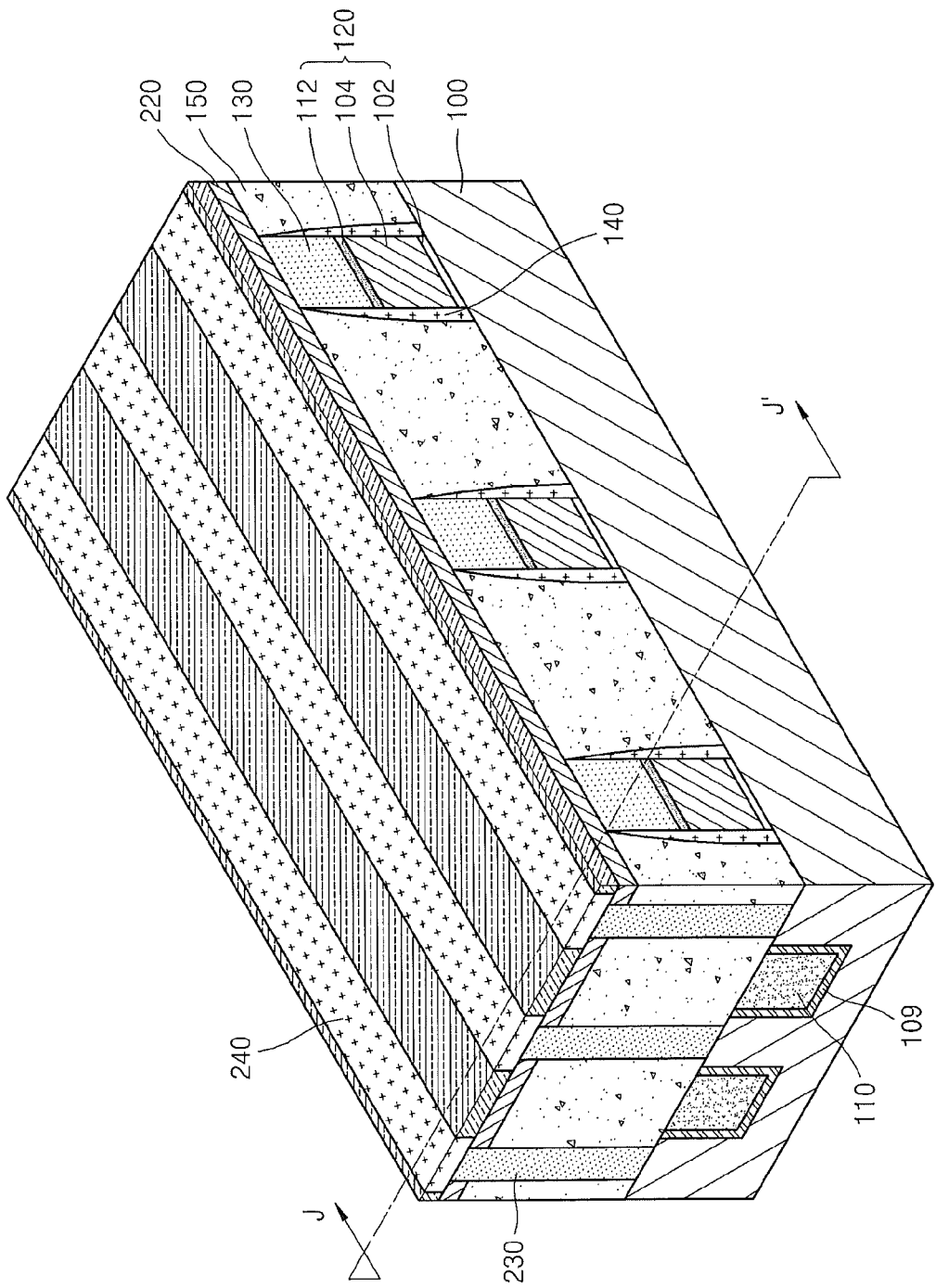
FIG. 27 is a perspective view of a non-volatile memory device, according to another embodiment of the inventive concept.
Figure 28:
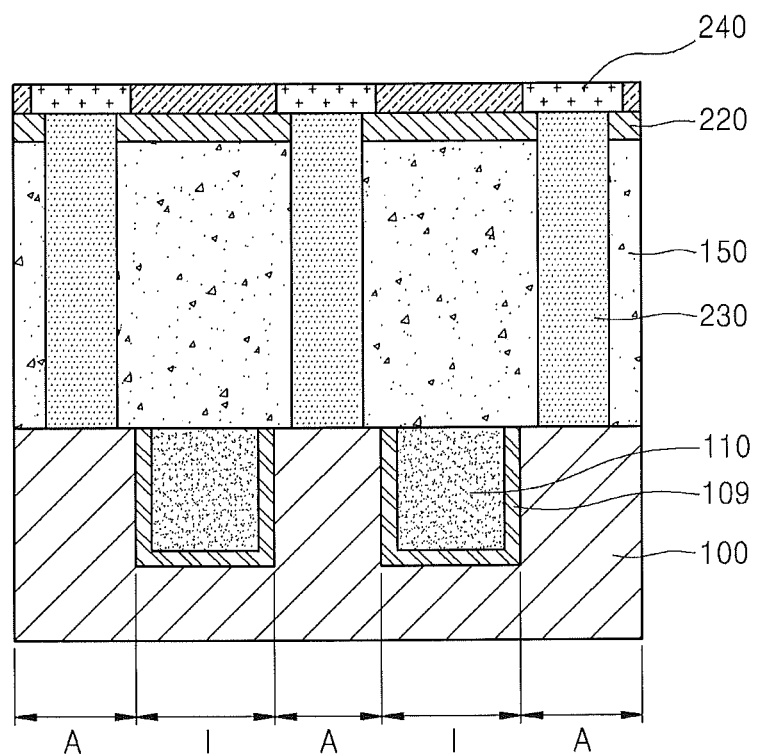
FIG. 28 is a cross-sectional view of the non-volatile memory device of FIG. 27 cut along a line J-J' of FIG. 27.
Figure 29:
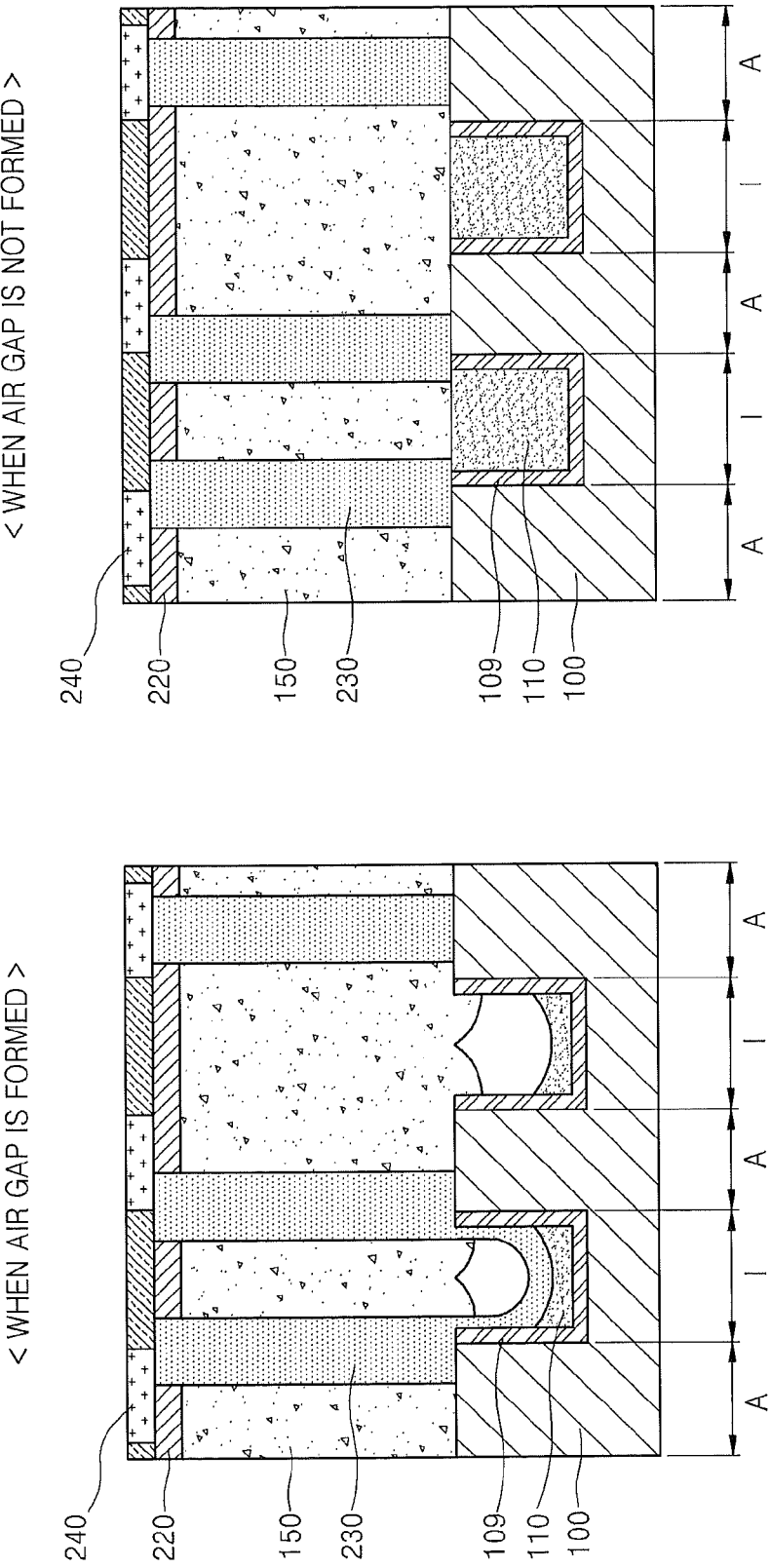
FIG. 29 is a view showing comparison between a cross-sectional view of a non-volatile memory device in which an air gap is formed when mis-alignment occurs and the cross-sectional view of the non-volatile memory device FIG. 27 cut along a line J-J' of FIG. 27.

The closing insulating layer 180 may prevent an electric short from occurring between contact plugs 230 of FIG. 28 due to misaligning while forming the contact plugs 230 when the air gap 160 is formed, which will be describe more fully with reference to FIGS. 27 through 29.

Figure 20:
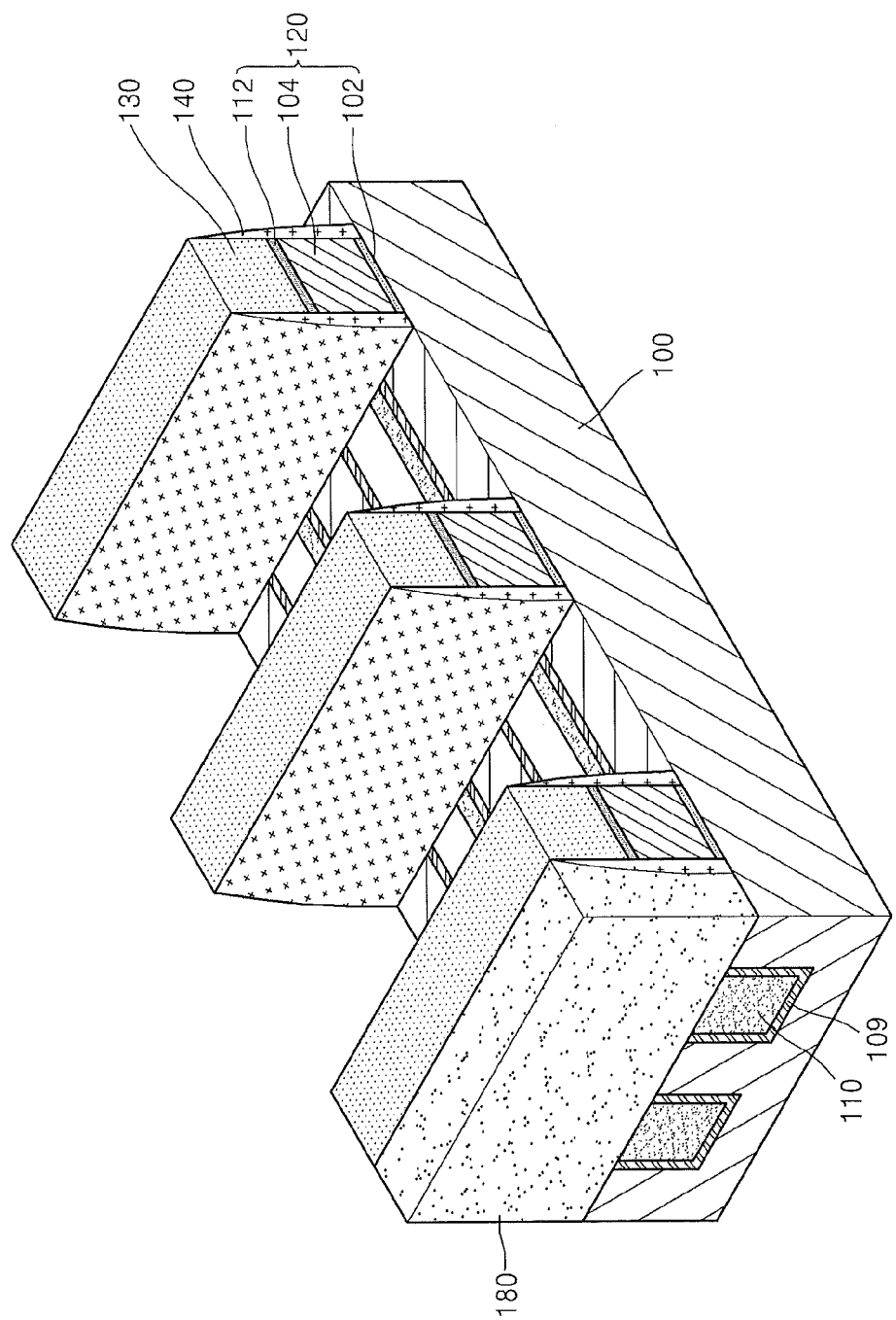

Referring to FIG. 20, the carbon-containing silicon oxide layer 110, through which the treatment is performed, is wet-etched, as illustrated in FIGS. 13A and 13B. The carbon component of portions of the carbon-containing silicon oxide layer 110 disposed below the closing insulating layer 180 is not removed. Accordingly, the carbon-containing silicon oxide layer 110 disposed below the closing insulating layer 180 can maintain a dense characteristic and thus is not etched during the wet-etching.

Figure 21:
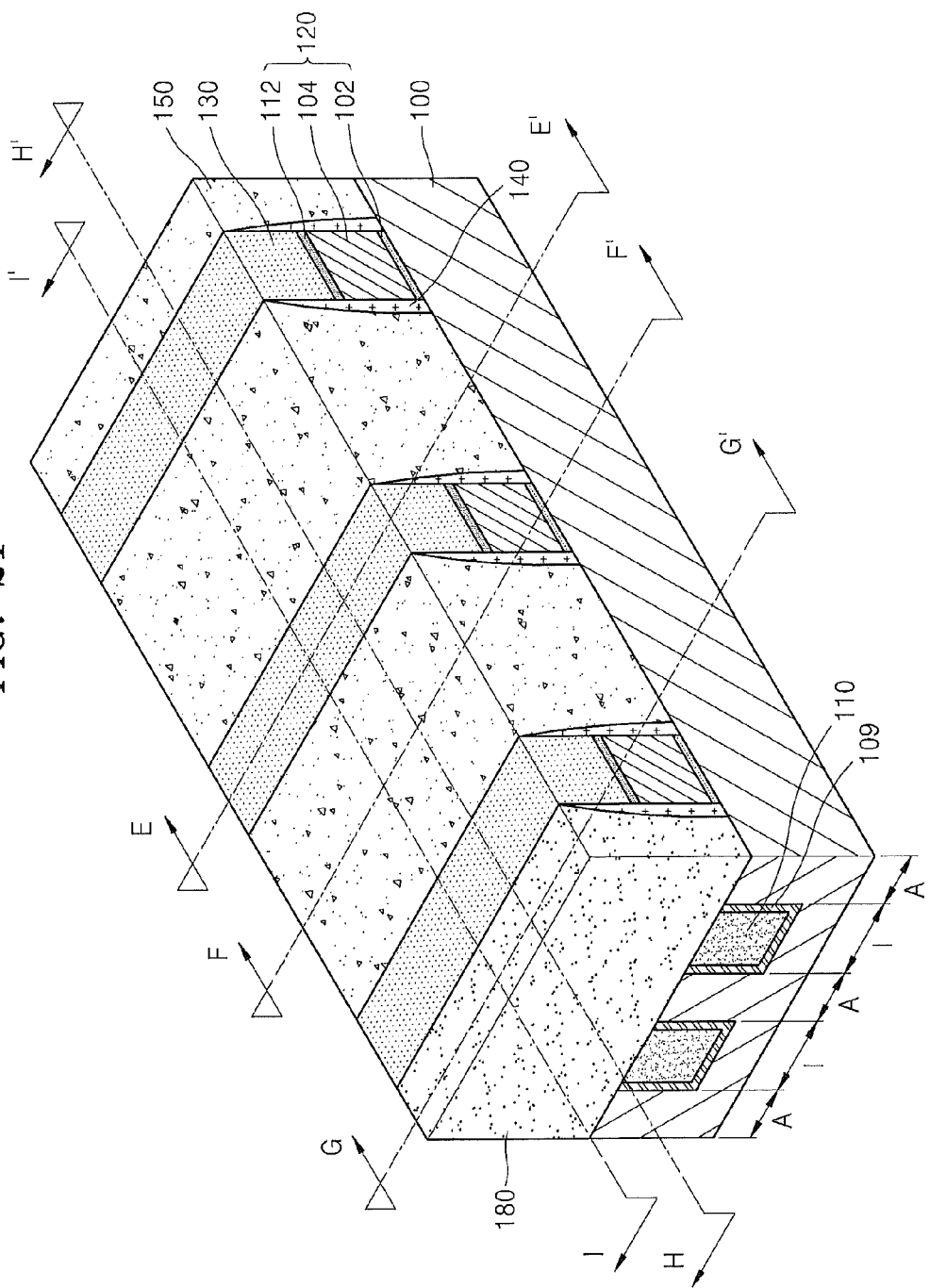

Referring to FIG. 21, the interlayer insulating layer 150 is formed to fill the gate insulating layer 120 and the gate conductive layer 130, as illustrated in FIG. 14. The closing insulating layer 180 may exist while the interlayer insulating layer 150 is formed. Optionally, the closing insulating layer 180 may be removed before the interlayer insulating layer 150 is formed and the interlayer insulating layer 150 may be formed on the recess unit 301 where the closing insulating layer 180 is previously formed.

As illustrated in FIG. 14, the air gap 160 may be formed between the interlayer insulating layer 150 and the liner oxide layer 109. However, the carbon-containing silicon oxide layer 110 disposed below the closing insulating layer 180 is not etched during etching and thus the air gap 160 may not be formed between the interlayer insulating layer 150 and the liner oxide layer 109.

Figure 22:
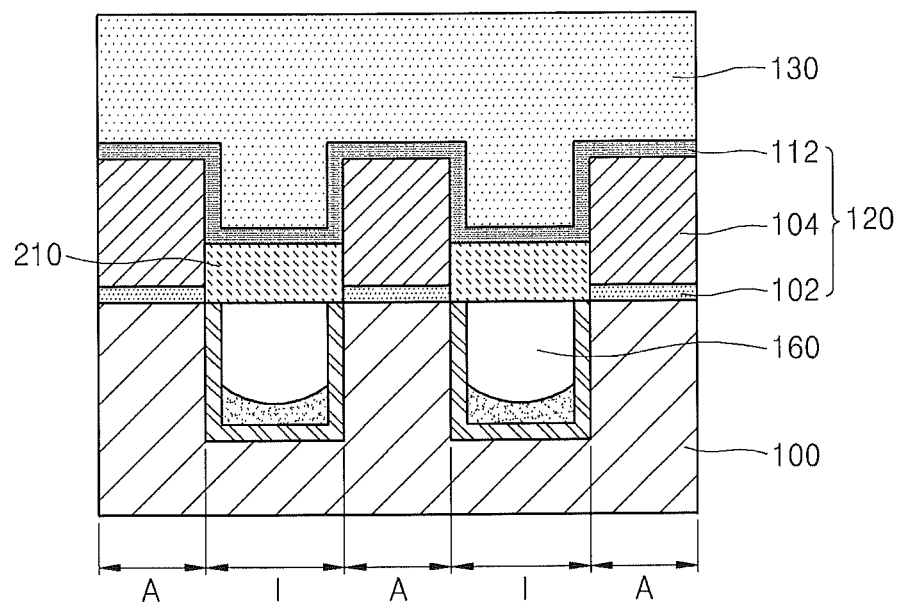
FIG. 22 is a cross-sectional view of the non-volatile memory device of FIG. 21 cut along a line E-E' of FIG. 21.
Figure 23:
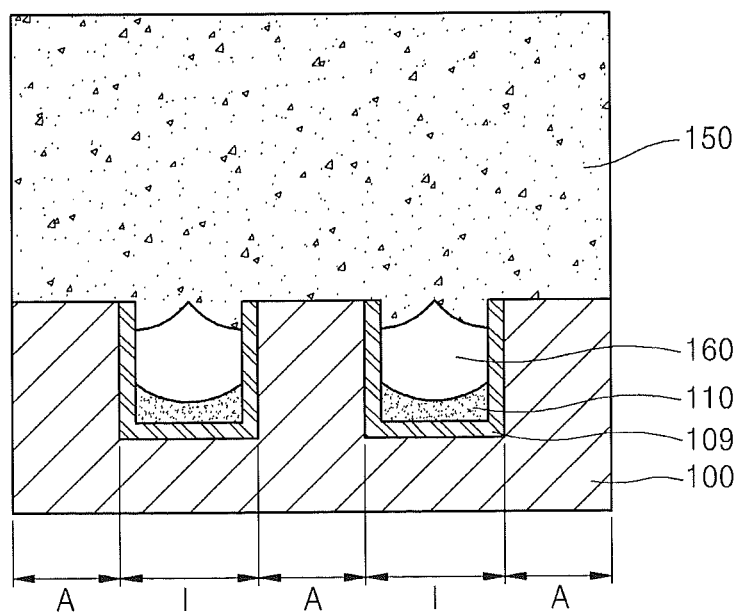
FIG. 23 is a cross-sectional view of the non-volatile memory device of FIG. 21 cut along a line F-F' of FIG. 21.
Figure 24:
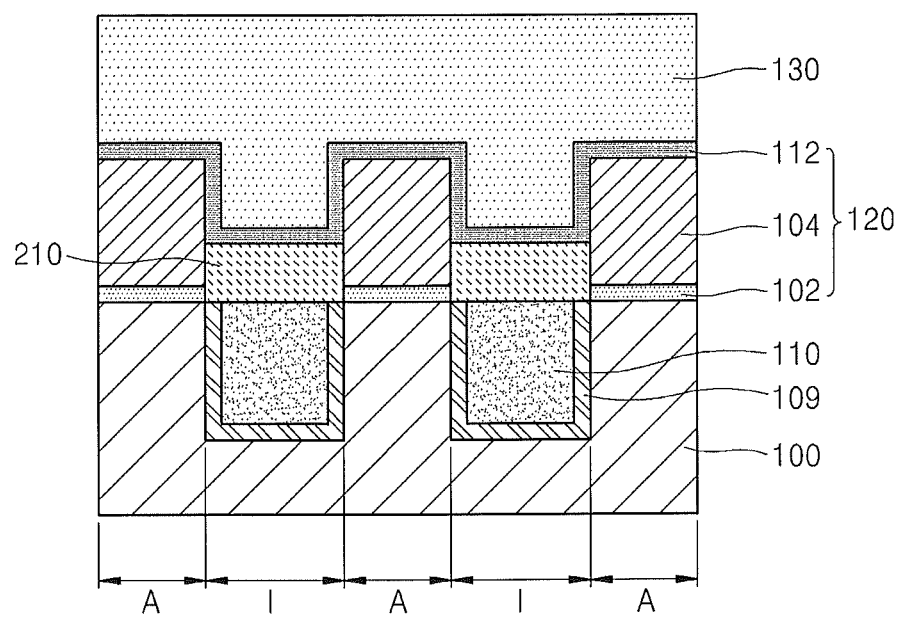
FIG. 24 is a cross-sectional view of the non-volatile memory device of FIG. 21 cut along a line G-G' of FIG. 21.
Figure 25:
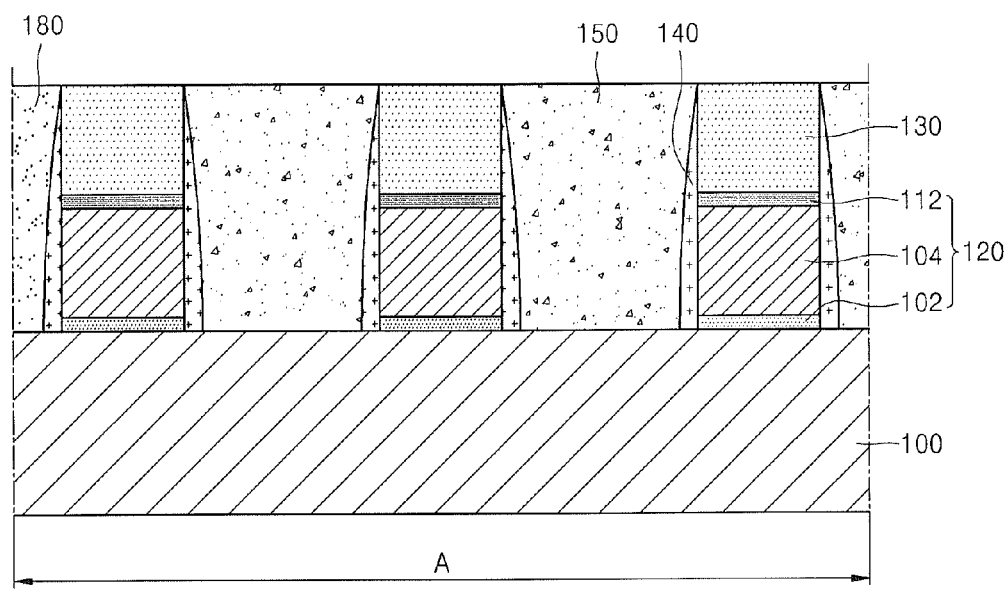
FIG. 25 is a cross-sectional view of the non-volatile memory device of FIG. 21 cut along a line H-H' of FIG. 21.
Figure 26:
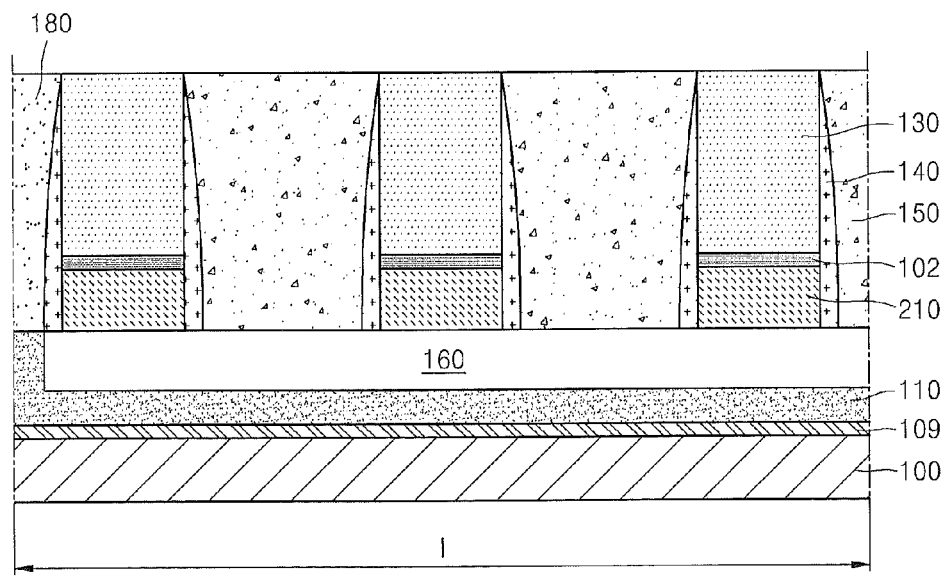
FIG. 26 is a cross-sectional view of the non-volatile memory device of FIG. 21 cut along a line I-I' of FIG. 21.

FIG. 22 is a cross-sectional view of the non-volatile memory device of FIG. 21 cut along a line E-E' of FIG. 21, FIG. 23 is a cross-sectional view of the non-volatile memory device of FIG. 21 cut along a line F-F' of FIG. 21, FIG. 24 is a cross-sectional view of the non-volatile memory device of FIG. 21 cut along a line G-G' of FIG. 21, FIG. 25 is a cross-sectional view of the non-volatile memory device of FIG. 21 cut along a line H-H' of FIG. 21, and FIG. 26 is a cross-sectional view of the non-volatile memory device of FIG. 21 cut along a line I-I' of FIG. 21.

Referring to FIG. 22, the air gap 160 is interposed between the blocking insulating layer 112 and the liner oxide layer 109, as illustrated in FIG. 2. In addition, the insulating layer 210 may be formed on the device isolation region I.

Referring to FIG. 23, the air gap 160 is interposed between the interlayer insulating layer 150 and the carbon-containing silicon oxide layer 110, as illustrated in FIG. 3. However, referring to FIG. 24, the carbon component of the carbon-containing silicon oxide layer 110 is not removed by the closing insulating layer 180 and thereby the carbon-containing silicon oxide layer 110 is not removed by wet etching. Accordingly, the air gap 160 is not formed between the interlayer insulating layer 150 and the carbon-containing silicon oxide layer 110 in the illustrated portion.

Referring to FIG. 25, a flash memory cell structure is formed on the active region A, as illustrated in FIG. 4. Referring to FIG. 26, the air gap 160 is formed on the device isolation region I between the active regions A, as illustrated in FIG. 5, and the air gap 160 prevents interference effect between channels. As described above, the air gap 160 is not formed on the portion of the device isolation region I corresponding to the closing insulating layer 180.

FIG. 27 is a perspective view of a non-volatile memory device, according to another embodiment of the inventive concept and FIG. 28 is a cross-sectional view of the non-volatile memory device of FIG. 27 cut along a line J-J' of FIG. 27. The method of manufacturing a non-volatile memory device according to the current embodiment includes the method of manufacturing a non-volatile memory device illustrated with reference to FIGS. 17 through 25. In this regard, the same description of the method will not be repeated.

Referring to FIGS. 27 and 28, an interlayer insulating layer 220 is further formed on the gate conductive layer 130 and the contact plugs 230 that penetrate the interlayer insulating layer 150 and 220 are formed. The contact plugs 230 are formed to contact some areas of the active regions A, and more specifically, may be formed on the active regions A that correspond to areas where the closing insulating layer 180 of FIG. 21 is previously formed. That is, the contact plugs 230 are formed on the active regions A that is adjacent to the device isolation regions I where the carbon-containing silicon oxide layer 110 is not removed. Then, bit line conductive layers 240 that are electrically connected to the contact plugs 230 are formed.

FIG. 29 is a view showing comparison between a cross-sectional view of the non-volatile memory device in which the air gap 160 is formed when mis-aligning occurs and the cross-sectional view of the non-volatile memory device FIG. 27 cut along a line J-J' of FIG. 27.

Referring to FIG. 29, the contact plugs 230 are formed by forming penetration holes that etch the interlayer insulating layers 150 and expose the active regions A and filling the penetration holes with a conductive material. However, if misaligning occurs when forming the contact plugs 230 and the penetration holes are connected to the areas where the air gap 160 is formed, the conductive material may be filled in the area where the air gap 160 is formed, while the conductive material fills the penetration holes. Accordingly, there may be an electric short between the contact plugs 230.

However, the closing insulating layer 180 is formed so as to prevent the air gap 160 from being formed on the portions of the carbon-containing silicon oxide layer 110. Accordingly, although misaligning occurs during forming the contact plugs 230, an electric short may be prevented from being generated between the contact plugs 230.

According to the embodiments of the inventive concept, the air gap is formed on the carbon-containing silicon oxide layer. However, the inventive concept is not limited thereto and may be applied to any structure in which the air gap is formed. That is, in a flash memory cell structure in which the air gap is formed, the air gap may not be formed only on the device isolation regions between the active regions on which the contact plugs are formed, and thus an electric short due to misalignment of the contact plugs may be prevented.

In addition, according to the embodiments of the inventive concept, the non-volatile memory device is illustrated. However, the inventive concept is not limited thereto. That is, in order to prevent interference effect between channel areas or active regions, the inventive concept may be used to all application fields to which forming the air gap in the device isolation region may be applied.

Figure 30:
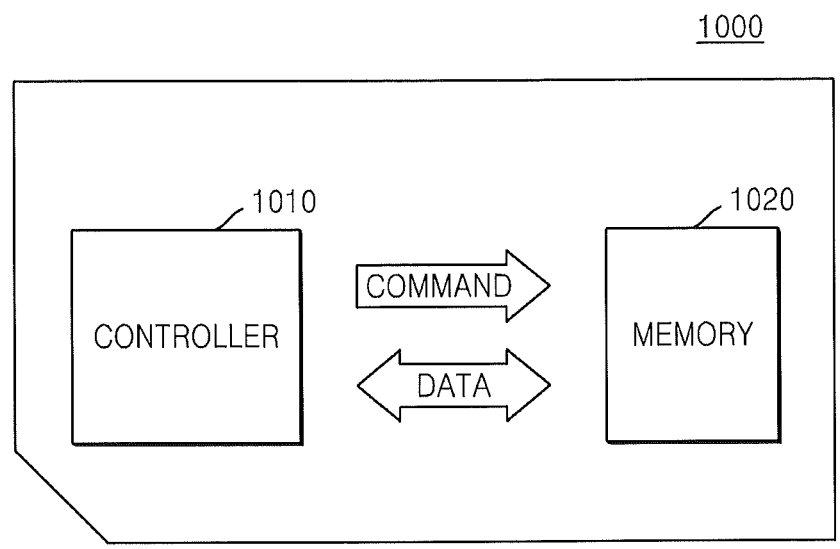
FIG. 30 is a block diagram schematically illustrating a card including a semiconductor device according to the embodiments of the inventive concept.

FIG. 30 is a block diagram schematically illustrating a card 1000 including a semiconductor device manufactured according to the method of manufacturing a non-volatile memory device according to the embodiment of the inventive concept.

Referring to FIG. 30, a controller 1010 and a memory 1020 may be disposed to communicate with each other. For example, when the controller 1010 gives a command, the memory 1020 may transmit data. The memory 1020 may include a semiconductor device manufactured according to any one of the methods of manufacturing a non-volatile memory device according to the embodiments of the inventive concept. The semiconductor device may be a "NAND" or "NOR" architecture memory array in correspondence to a corresponding logic gate design as well known in the field to which the inventive concept pertains. The memory array arranged in a plurality of rows and columns may constitute one or more memory array banks. The memory 1020 may include the memory array or the memory array bank. Also, in order to operate the memory array bank, the card 1000 may further include a general row decoder, a column decoder, I/O buffers, and/or a control register. The card 1000 may be used in a memory device such as a memory stick card, a smart media (SM) card, a secure digital (SD) card, a mini SD card, or a multi media card (MMC).

Figure 31:
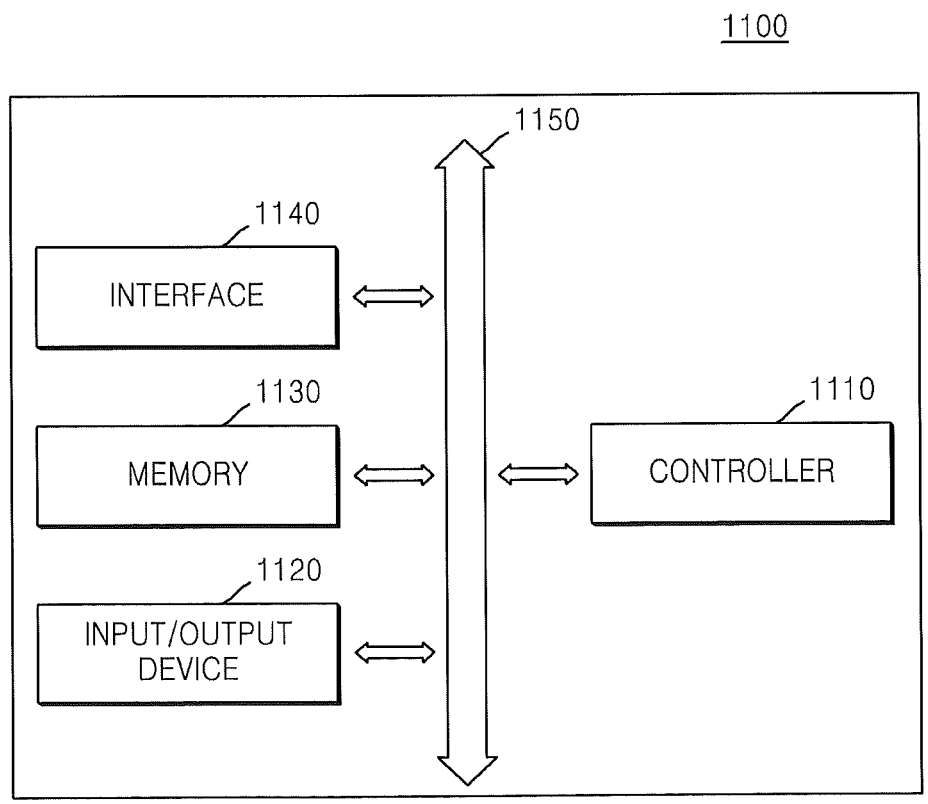
FIG. 31 is a block diagram schematically illustrating a system including a semiconductor device according to embodiments of the inventive concept.

FIG. 31 is a block diagram schematically illustrating a system 1100 including a semiconductor device manufactured according to the method of manufacturing a non-volatile memory device according to the embodiments of the inventive concept.

Referring to FIG. 31, the system 1100 may include a controller 1110, an input/output device 1120, a memory 1130, and an interface 1140. The system 1100 may be a mobile system or a system that transmits and receive information. The mobile system may include a PDA, a portable computer, a web tablet, a wireless phone, a mobile phone, a digital music player, or a memory card. The controller 1110 may execute program and control the system 1100. The controller 1110 may be, for example, a microprocessor, a digital signal processor, a microcontroller, or any similar device. The input/output device 1120 may be used to input or output data of the system 1100. The system 1100 is connected to an external device, for example, a personal computer or a network, by using the input/output device 1120 and thus may communicate data with the external device. The input/output device 1120 may be, for example, a keypad, a keyboard, or a display. The memory 1130 may store code and/or data for operating the controller 1110 and/or store data processed in the controller 1110. The memory 1130 may include a semiconductor device manufactured according to any one of the methods of manufacturing a non-volatile memory device according to the embodiments of the inventive concept. The interface 1140 may be a data transmission path between the system 1100 and an external device. The controller 1110, the input/output device 1120, the memory 1130, and the interface 1140 may communicate with each other through a bus 1150. For example, the system 1100 may be used in mobile phones, MP3 players, navigations, portable multimedia players (PMP), solid state disks (SSD), or household appliances.

It will be understood that shapes of each element in the accompanying drawings are exemplarily illustrated to fully understand the inventive concept and the elements may have various shapes. In the drawings, like reference numerals denote like elements.

While the inventive concept has been particularly shown and described with reference to exemplary embodiments thereof, it will be understood that various changes in form and details may be made therein without departing from the spirit and scope of the following claims.

What is claimed is:

1. A non-volatile memory device comprising:
    a plurality of gate structures on active regions of a substrate having associated impurity regions therein;
    a plurality of isolation regions in trenches in the substrate separating the impurity regions from one another;
    an oxide liner layer in the trenches; and
    a carbon-containing silicon oxide layer filling the trenches.

2. The non-volatile memory device of claim 1 further comprising:
    an interlayer insulating layer above the carbon-containing silicon oxide layer, bridging openings in the trenches.

3. The non-volatile memory device of claim 1 wherein the carbon-containing silicon oxide layer comprises a porous heat-treated carbon-containing silicon oxide layer having a reduced carbon component constituent therein.

4. The non-volatile memory device of claim 1 further comprising:
    a closing insulating layer on a sidewall of at least one of the gate structures, bridging an opening in the trenches.

5. The non-volatile memory device of claim 1 further comprising:
    an air gap above a surface of the carbon-containing silicon oxide layer.

6. The non-volatile memory device of claim 1 further comprising:
    a low-K material above a surface of the carbon-containing silicon oxide layer.

* * * * *